(12) United States Patent
Song et al.

(10) Patent No.: US 8,218,110 B2
(45) Date of Patent: Jul. 10, 2012

(54) THIN FILM TRANSISTOR ARRAY PANEL AND METHOD OF MANUFACTURING THE SAME

(75) Inventors: Jean-Ho Song, Seoul (KR); Yang-Ho Jung, Yongin-si (KR); Hoon Kang, Suwon-si (KR); Jae-Sung Kim, Yongin-si (KR); Jae-Hyoung Youn, Seoul (KR); Jong-In Kim, Yongin-si (KR); Sang-Soo Kim, Seoul (KR); Shi-Yul Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 538 days.

(21) Appl. No.: 12/434,945

(22) Filed: May 4, 2009

(65) Prior Publication Data

US 2010/0053507 A1 Mar. 4, 2010

(30) Foreign Application Priority Data

Aug. 26, 2008 (KR) ........................ 10-2008-0083420

(51) Int. Cl.
*G02F 1/1335* (2006.01)
(52) U.S. Cl. ..................................... 349/106
(58) Field of Classification Search ............ 349/42, 349/110, 122, 138, 106–108
See application file for complete search history.

(56) References Cited

U.S. PATENT DOCUMENTS

| 6,927,815 | B2* | 8/2005 | Lai | 349/108 |
| 7,292,294 | B2 | 11/2007 | Hung et al. | |
| 2006/0202199 | A1* | 9/2006 | Kim et al. | 257/40 |
| 2007/0013839 | A1* | 1/2007 | Rho | 349/114 |
| 2008/0030833 | A1* | 2/2008 | Park | 359/259 |

FOREIGN PATENT DOCUMENTS

| JP | 2001-056467 | 2/2001 |
| JP | 2002-131735 | 5/2002 |
| JP | 2004-246289 | 9/2004 |
| JP | 2007-041450 | 2/2007 |
| KR | 10-2002-0071542 | 9/2002 |
| KR | 10-2005-0003257 | 1/2005 |
| KR | 10-2005-0040258 | 5/2005 |
| KR | 10-2007-0077702 | 7/2007 |
| KR | 10-2008-0029337 | 4/2008 |

* cited by examiner

*Primary Examiner* — Mark Robinson
*Assistant Examiner* — Charles Chang
(74) *Attorney, Agent, or Firm* — Cantor Colburn LLP

(57) ABSTRACT

After increasing the thickness of a gate line and forming a barrier rib that is made of an organic material, a gate insulating layer is formed and then a color filter is formed with an Inkjet method using the barrier rib. By increasing a thickness of the gate line, even if the size of a substrate increases, problems due to signal delay are reduced, and by forming a barrier rib with an organic material, the height of the barrier rib increases, and a taper angle increases and thus a color filter is stably formed.

19 Claims, 34 Drawing Sheets

FIG.3
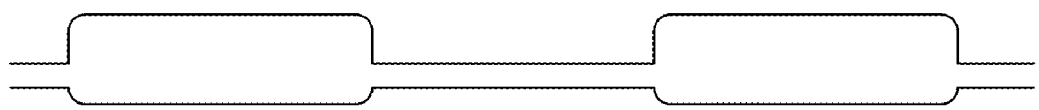
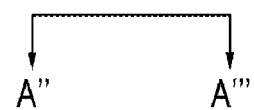
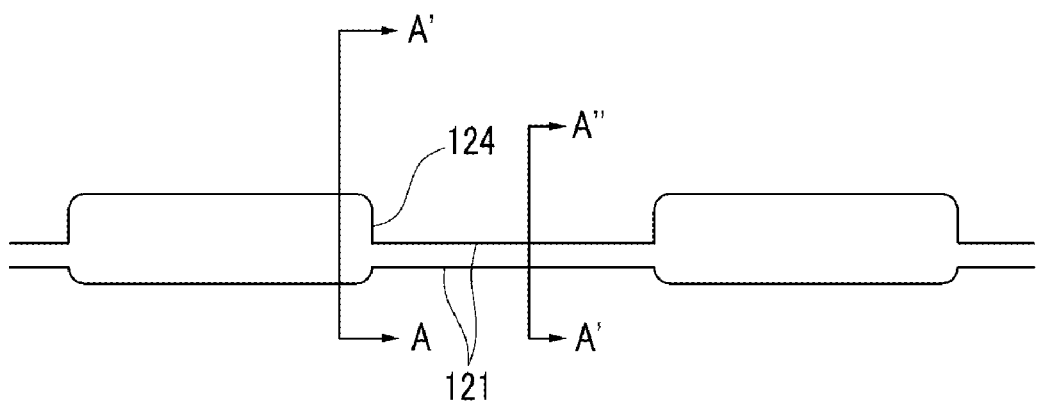

THIN FILM TRANSISTOR ARRAY PANEL AND METHOD OF MANUFACTURING THE SAME

This application claims priority to Korean Patent Application No. 10-2008-0083420, filed on Aug. 26, 2008, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor ("TFT") array panel and a method of manufacturing the same. More particularly, the present invention relates to a TFT array panel having a color filter formed thereon, and a method of manufacturing the TFT array panel.

(b) Description of the Related Art

A liquid crystal display ("LCD") is one type of flat panel display that is currently most widely used, it includes two display panels in which electrodes are formed and a liquid crystal layer that is inserted therebetween, and it rearranges liquid crystal molecules of the liquid crystal layer by applying a voltage to the electrodes, thereby adjusting an amount of transmitted light.

Currently, an LCD having a structure in which field generating electrodes are provided in each of two display panels among LCDs is generally used. That is, an LCD having a structure in which a plurality of TFTs and pixel electrodes are arranged in a matrix form in one display panel (hereinafter referred to as a "TFT array panel"), and red, green, and blue color filters are formed in the other display panel (hereinafter referred to as a "common electrode panel") whose entire surface is covered with a common electrode is mainly used.

However, in such an LCD, because a pixel electrode and a color filter are formed in different display panels, it is difficult for the pixel electrode and the color filter to be accurately aligned and thus an alignment error may occur.

In order to solve the problem, a color filter on array ("CoA") structure that forms the color filter and the pixel electrode in the same display panel has been suggested. In this case, a light blocking member as well as the color filter is generally formed in the same display panel as that of the pixel electrode.

When the color filter is formed in the same display panel as that of the pixel electrode, in order to reduce manufacturing time and cost by simplifying a manufacturing process, the color filter is formed with an Inkjet printing method. In order to use an Inkjet method, a barrier rib is formed with the light blocking member.

BRIEF SUMMARY OF THE INVENTION

It has been determined herein, according to the present invention, that because the barrier rib in a conventional CoA structure that is formed with the light blocking member has a low height, it is insufficient to accurately divide the color filter that is formed with an Inkjet method.

It has been further determined herein, according to the present invention, that in the conventional CoA structure, there is a problem that it is not easy to form a contact hole for electrically connecting the pixel electrode and a drain electrode. This is because the color filter or the light blocking member is positioned between the pixel electrode and the drain electrode and thus the color filter or the light blocking member should be removed to form the contact hole, however it is not easy to remove the color filter or the light blocking member.

Further, currently, the size of the LCD is increasing, and as the size of a substrate increases, a gate voltage that is applied through a gate line of a conventional structure is delayed. If a gate voltage is delayed, a sufficient time period in which a data voltage is to be charged to the pixel is not provided and thus the pixel does not display desired luminance.

The present invention has been made in an effort to provide a TFT array panel and a method of manufacturing the same having advantages of more surely forming a color filter using a barrier rib of a different structure that does not include a light blocking member when forming a color filter with an Inkjet printing method, and allowing smooth electrical contact of a pixel electrode and a drain electrode by easily forming a contact hole that exposes the drain electrode.

The present invention has been made in an effort to further provide a TFT array panel and a method of manufacturing the same having advantages of lowering a resistance value of a gate line by increasing the thickness of the gate line and thus reducing a delay of a signal that is transferred through the gate line.

An exemplary embodiment of the present invention provides a TFT array panel including an insulation substrate, a gate line disposed on the insulation substrate and including a gate electrode, a barrier rib that is made of an organic material and that includes a vertical part, a color filter that is formed in a region that is defined by the barrier rib, a TFT that includes the gate electrode on the barrier rib, and a data line that intersects the gate line and that is disposed along the vertical part of the barrier rib on the barrier rib.

The portions of the thin film transistor may be a part of a source electrode or a drain electrode of the thin film transistor.

A portion of the barrier rib that on an upper part of the gate electrode may have a smaller thickness than other parts of the barrier rib, or may be removed to expose the gate electrode.

The gate line may have a thickness of about 0.3 μm to about 5 μm.

The barrier rib may have a thickness of about 0.3 μm to about 10 μm.

The color filter may have a thickness of about 1 μm to about 4 μm.

A thickness difference between the color filter and the barrier rib may be about 2 μm or less.

The organic material that forms the barrier rib may have a dielectric constant of about 3.5 or less.

The TFT array panel may further include a gate insulating layer disposed on the barrier rib and a passivation layer disposed on the TFT and the gate insulating layer, wherein the color filter is disposed on the passivation layer. The TFT array panel may further include an organic capping layer disposed on the color filter and passivation layer, a pixel electrode disposed on the organic capping layer, and a light blocking member disposed on portions of the pixel electrode and the organic capping layer, wherein the barrier rib does not include a light blocking member.

Alternatively, the TFT array panel may further include a gate insulating layer disposed on the barrier rib, wherein the color filter is disposed between the gate insulating layer and the insulation substrate. The TFT array panel may further include a passivation layer disposed on the TFT and the gate insulating layer, an organic capping layer disposed on the passivation layer, a pixel electrode disposed on the organic capping layer, and a light blocking member disposed on portions of the pixel electrode and the organic capping layer, wherein the barrier rib does not include a light blocking member.

In either exemplary embodiment, the barrier rib need not include a light blocking member.

The TFT array panel may further include a pixel electrode in contact with the TFT through a contact hole and a light blocking member disposed on portions of the pixel electrode, wherein the contact hole does not pass through the color filter or through the light blocking member.

The organic material for the barrier rib may be a transparent organic material.

Another exemplary embodiment of the present invention provides a method of manufacturing a TFT array panel, including forming gate lines and a gate electrode on an insulation substrate, forming a barrier rib, including a horizontal part that contacts and overlaps the gate line and a vertical part, with an organic material, forming a gate insulating layer and a semiconductor layer on the barrier rib, forming data lines and a drain electrode on the gate insulating layer and the semiconductor, forming a passivation layer that covers the semiconductor, the data lines, and the drain electrode, and forming a color filter with an Inkjet method in a region that is partitioned by the barrier rib on the passivation layer.

The method may further include forming a part of the barrier rib on upper part of the gate electrode to have a smaller thickness than other parts of the barrier rib, or removing a part of the barrier rib in order to expose the gate electrode.

The gate line may have a thickness of about 0.3 μm to about 5 μm.

The barrier rib may have a thickness of about 0.3 μm to about 10 μm.

The color filter may have a thickness of about 1 μm to about 4 μm.

A thickness difference between the color filter and the barrier rib may be about 2 μm or less.

The organic material that forms the barrier rib may have a dielectric constant of about 3.5 or less.

The method may further include forming the barrier rib with exposure and development of one time using a mask including a transflective region or a slit pattern.

Yet another exemplary embodiment of the present invention provides a method of manufacturing a TFT array panel, the method including forming a gate line and a gate electrode on an insulation substrate, forming a barrier rib including, a horizontal part that contacts and overlaps the gate line and a vertical part, with an organic material, forming a color filter with an Inkjet method in a region that is partitioned by the barrier rib on the barrier rib, forming a gate insulating layer and a semiconductor layer on the color filter, forming a data line and a drain electrode on the gate insulating layer and the semiconductor, and forming a passivation layer that covers the semiconductor, the data line, and the drain electrode.

The method may further include forming a part of the barrier rib on an upper part of the gate electrode to have a smaller thickness than other parts of the barrier rib, or removing the part of the barrier rib on the gate electrode in order to expose the gate electrode.

The gate line may have a thickness of about 0.3 μm to about 5 μm.

The barrier rib may have a thickness of about 0.3 μm to about 10 μm.

The color filter may have a thickness of about 1 μm to about 4 μm.

A thickness difference between the color filter and the barrier rib may be about 2 μm or less.

The organic material that forms the barrier rib may have a dielectric constant of about 3.5 or less.

Forming the barrier rib may include removing a part of the barrier rib or completely removing the barrier rib in a region where the gate electrode and the horizontal part overlap, and forming the barrier rib with exposure and development of one time using a mask including a transflective region or a slit pattern.

As described above, according to an exemplary embodiment of the present invention, after highly forming a barrier rib that does not include a light blocking member and that is formed with an organic film, by forming a color filter with an Inkjet process, a color sense of the color filter can be improved, color mixture between adjacent color filters can be prevented, and a contact hole that exposes a drain electrode can be easily formed. Further, by reducing delay of a signal that is transferred through a gate line by increasing the thickness of the gate line, even if the size of a substrate increases and resolution improves, a charge time period of a pixel can be fully provided. As a result, display quality is improved. Because nothing other than the common electrode is formed in an opposite substrate, a manufacturing process of the opposite substrate becomes simple and erroneous alignment of both substrates is substantially prevented.

BRIEF DESCRIPTION OF THE DRAWINGS

The above and other features and advantages of the present invention will become more apparent by describing exemplary embodiments thereof with reference to the accompanying drawings, in which:

FIGS. 3, 5, 7, 9, 11, 13, and 15 are layout views in intermediate steps of an exemplary method of manufacturing an exemplary TFT array panel according to an exemplary embodiment of the present invention;

DETAILED DESCRIPTION OF THE INVENTION

Figure 1:
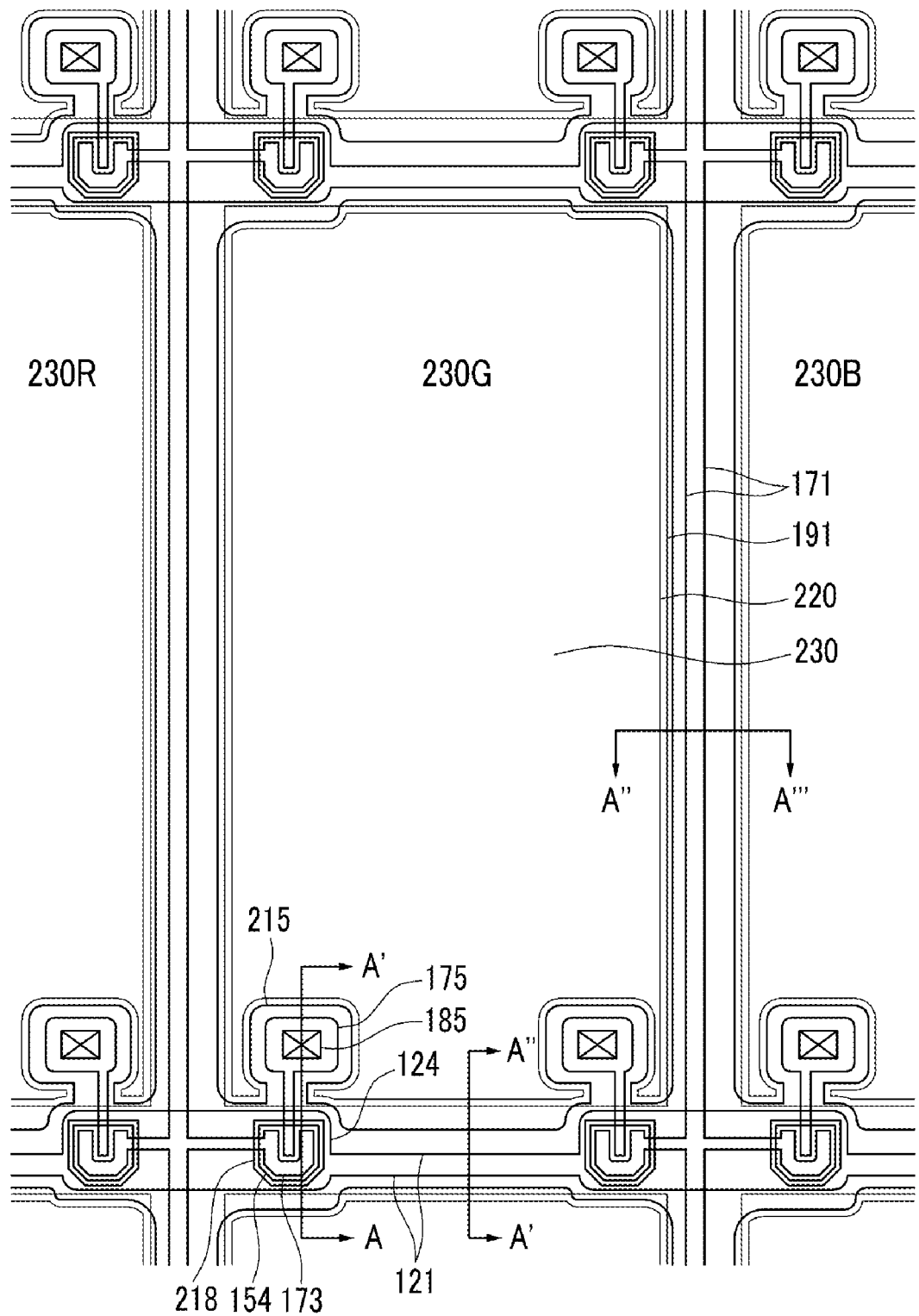
FIG. 1 is a layout view of an exemplary TFT array panel for an exemplary liquid crystal display ("LCD") according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A TFT array panel for a liquid crystal display ("LCD") according to an exemplary embodiment of the present invention will now be described in detail with reference to FIGS. 1 and 2.

Figure 2:
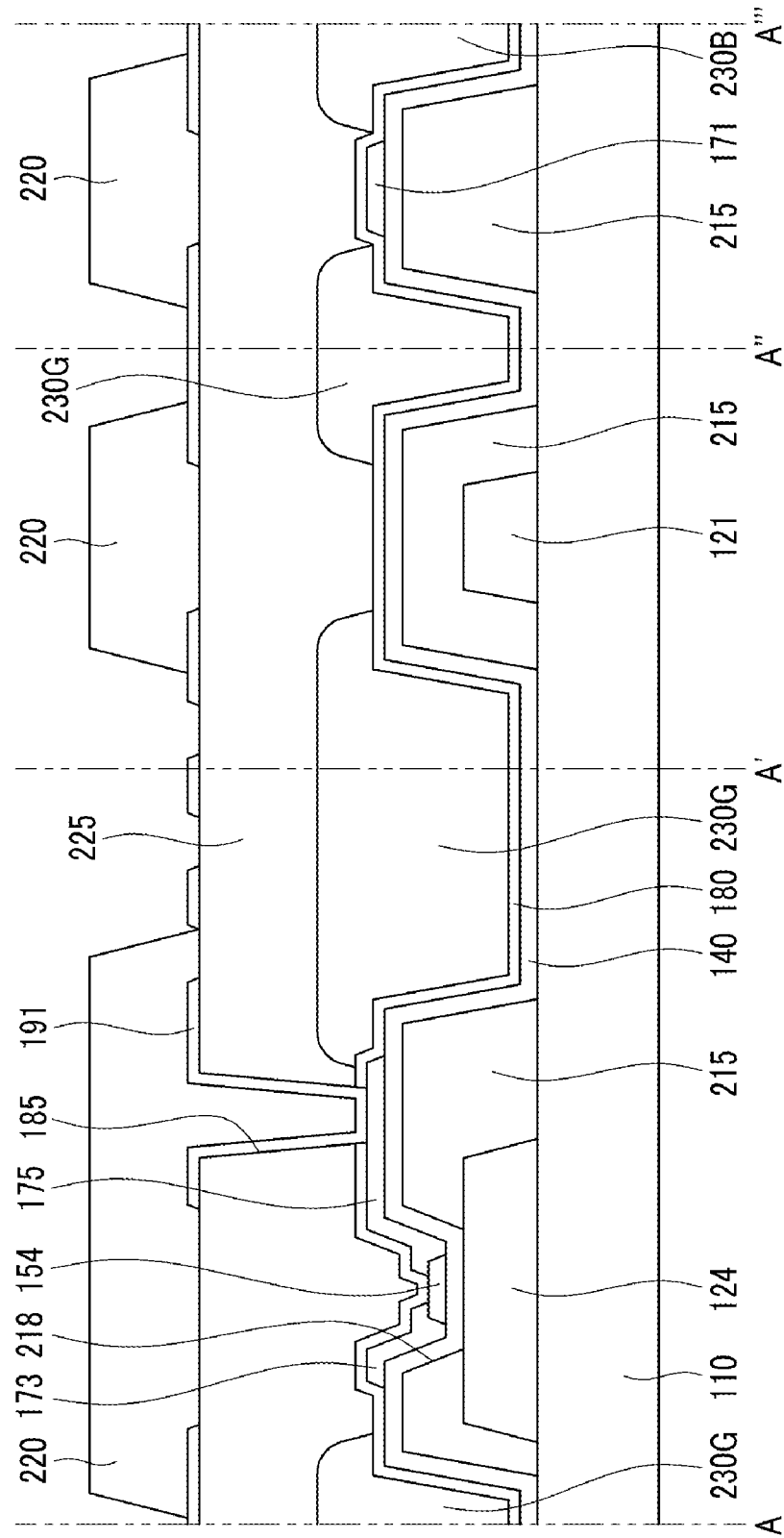
FIG. 2 is a cross-sectional view of the exemplary TFT array panel taken along lines A-A', A'-A", and A"-A'" of FIG. 1.

FIG. 1 is a layout view of an exemplary TFT array panel for an exemplary LCD according to an exemplary embodiment of the present invention, and FIG. 2 is a cross-sectional view of the TFT array panel taken along lines A-A', A'-A", and A"-A''' of FIG. 1.

A plurality of gate lines 121 are formed or otherwise disposed on an insulation substrate 110 that is made of transparent glass, plastic, or other material.

The gate lines 121 transfer a gate signal and generally extend in a horizontal direction, such as a first direction. Each gate line 121 includes a wide end part (not shown) for connecting a plurality of gate electrodes 124 that are vertically protruded from the gate lines 121 with other layers or an external driving circuit.

The gate line 121 is formed with aluminum (Al), copper (Cu), or alloys thereof, and may have a thickness of about 0.5 μm to about 5 μm. Because the gate line 121 is very thick, the insulation substrate 110 may be deformed when forming the gate line 121, and in order to prevent this, a buffer layer (see 115 of FIG. 33) that is made of silicone nitride (SiNx), etc., may be additionally formed or otherwise disposed between the insulation substrate 110 and the gate line 121. As a thickness of the gate line 121 increases, RC delay of a signal flowing in the gate line 121 decreases. While particular materials are described for the gate line 121, the gate line 121 may be made of or include various metals or conductors, and the present invention is characterized in that the gate line 121 is formed with an increased thickness.

A side surface of the gate line 121 is inclined to the surface of the substrate 110, and a tilt angle thereof is preferably about 30° to about 80°.

A barrier rib 215 that is made of an organic material having a dielectric constant of about 3.5 or less is formed or otherwise disposed on the gate line 121. The barrier rib 215 divides a horizontal part that is formed along the gate line 121 and adjacent pixels in a horizontal direction, includes a vertical part that is formed or otherwise disposed at a position at which a data line is to be formed and a contact part that is formed or otherwise disposed at a position at which a pixel electrode and a drain electrode are connected, and partitions a region where a color filter is to be formed. The barrier rib 215 may have a thickness of about 0.5 μm to about 10 μm and has a height of 1 μm to 4 μm from the gate line 121, and because the barrier rib 215 is etched on the gate electrode 124, the barrier rib 215 is formed with a thin thickness. According to exemplary embodiments, as the entire barrier rib 215 is etched, the gate electrode 124 may be exposed through opening 218 in the barrier rib 215. The barrier rib 215 that is made of an organic material is inclined to a surface of the substrate 110, and a tilt angle thereof is preferably about 50° to about 120°. Here, a tilt angle of more than 90° illustrates an inverse taper structure. Further, as an organic material that forms the barrier rib 215, an organic material having a low dielectric constant of 3.5 or less, or an organic material in which at least one material of a surfactant, a silicon (Si)-based material, and a fluorine (F)-based material is added, may be used. Further, through adjusting an additive (fluorine, etc.) that is added to a material that forms an organic film, or through surface treatment after forming the barrier rib 215 with an organic film, a profile of the barrier rib 215 can be adjusted.

A gate insulating layer 140 that is made of silicon nitride (SiNx) or silicon oxide (SiOx) is formed on the barrier rib 215 and the substrate 110, as well as on exposed portions of the gate electrode 124 in the opening 218. According to exemplary embodiments, the gate insulating layer 140 has various thicknesses between about 0.3 μm to about 3 μm.

A plurality of semiconductor islands 154 that are made of hydrogenated amorphous silicon ("a-Si"), polysilicon, or so on are formed on the gate insulating layer 140. In the area of the semiconductor 154, the barrier rib 215 is formed in a thin thickness, or the semiconductor 154 is positioned on the removed portion of the barrier rib 215 on the gate electrode 124 in the opening 218, and the semiconductor 154 is formed at a lower position than the height of the barrier rib 215.

A plurality of ohmic contact islands (not shown) are formed on the semiconductor 154. The ohmic contacts may be made of a material such as n+ hydrogenated amorphous silicon in which n-type impurities such as phosphorus are doped with a high concentration, or may be made of silicide. The ohmic contacts are formed in pairs and are disposed on the semiconductor 154.

Side surfaces of the semiconductors 154 and the ohmic contacts may also be inclined to a surface of the substrate 110, and a tilt angle thereof is preferably about 30° to about 80°.

A plurality of data lines 171 and a plurality of drain electrodes 175 are formed on the semiconductors 154 and the gate insulating layer 140.

The data lines 171 transfer a data signal and generally extend in a vertical direction, a second direction that may be substantially perpendicular to the first direction, and intersect the gate lines 121. Each data line 171 is formed in a vertical part of the barrier rib 215. Each data line 171 includes a wide end part (not shown) for connecting a plurality of source electrodes 173 that are extended from the data line 171 toward the gate electrode 124 and other layers or an external driving circuit.

The drain electrode 175 is separated from the data line 171 and is opposite to the source electrode 173 above the gate electrode 124. Each drain electrode 175 includes one wide end part and a bar-shaped end part. The wide end part is formed on a contact part of the barrier rib 215, and a part of the bar-shaped end part is surrounded with the source electrode 173 that may be bent in a U shape.

One gate electrode 124, one source electrode 173, and one drain electrode 175 together with the semiconductor 154 form one TFT, and a channel of the TFT exists within a region where the barrier rib 215 is removed and is formed in the semiconductor 154 between the source electrode 173 and the drain electrode 175.

The data line 171 and the drain electrode 175 may be formed in a structure of a single layer, a dual layer, or a triple layer with various metals, and it is preferable that side surfaces of the data line 171 and the drain electrode 175 are inclined with a tilt angle of about 30° to about 80° relative to the surface of the substrate 110.

An ohmic contact (not shown) may be provided between the semiconductor 154 and the data line 171 and drain electrode 175, and lowers contact resistance therebetween.

A passivation layer 180 is formed on the data line 171, the drain electrode 175, and the exposed portion of the semiconductor 154, as well as on exposed portions of the gate insulating layer 140. The passivation layer 180 is made of an inorganic insulator such as silicon nitride and silicon oxide.

A color filter 230 is formed with an Inkjet method in a region that is positioned on the passivation layer 180 and where the barrier rib 215 is not formed. The color filter 230 includes at least three colors (for example primary colors or red, green, and blue), and uses different pigments for each color. Because the barrier rib 215 that is made of an organic material has a high height, the color filter 230 may be fully filled within the barrier rib 215, and because the barrier rib 215 has a great taper angle, the color filter 230 can be uniformly formed. The color filter 230 is formed in a thickness of about 1 μm to about 4 μm. Further, in FIG. 2, the color filter 230 is formed at a higher height than that of the barrier rib 215, but heights of the color filter 230 and the barrier rib 215 are not limited thereto, and the color filter 230 may have a lower height than or the same height as that of the barrier rib 215. Further, it is preferable that a thickness difference between the color filter 230 and the barrier rib 215 is about 2 μm or less.

An organic capping layer 225 is formed on the passivation layer 180 and the color filter 230. A plurality of contact holes 185 that expose the drain electrodes 175 are formed in a region corresponding to the drain electrodes 175 in the organic capping layer 225 and in the passivation layer 180. The organic capping layer 225 is formed in a thickness of about 1 μm to about 5 μm.

A plurality of pixel electrodes 191 are formed on the organic capping layer 225. Although not shown, each pixel electrode 191 may be divided into two subpixel electrodes that receive a data voltage from each of two lateral TFTs, and each subpixel electrode may include a micro-slit pattern. An exemplary embodiment including such an arrangement is described in FIG. 34.

A light blocking member 220 is formed on the organic capping layer 225, and the light blocking member 220 is formed in an upper part of a position at which the barrier rib 215 is formed, so as to overlap the barrier rib 215, and has a wider width than that of the barrier rib 215. In other words, a footprint of the barrier rib 215 lies within a footprint of the light blocking member 220. The light blocking member 220 may have different heights, and the light blocking member 220 having a higher height may also perform a function of a spacer for sustaining a gap between an upper substrate and a lower substrate.

An exemplary method of manufacturing the exemplary TFT array panel that is shown in FIGS. 1 and 2 is described hereinafter in detail with reference to FIGS. 1 to 16.

FIGS. 3, 5, 7, 9, 11, 13, and 15 are layout views of intermediate steps of an exemplary method of manufacturing an exemplary TFT array panel according to an exemplary embodiment of the present invention, and FIGS. 4, 6, 8, 10, 12, 14, and 16 are cross-sectional views of the exemplary TFT array panel taken along lines A-A', A'-A", and A"-A''' of FIGS. 3, 5, 7, 9, 11, 13, and 15.

Figure 4:
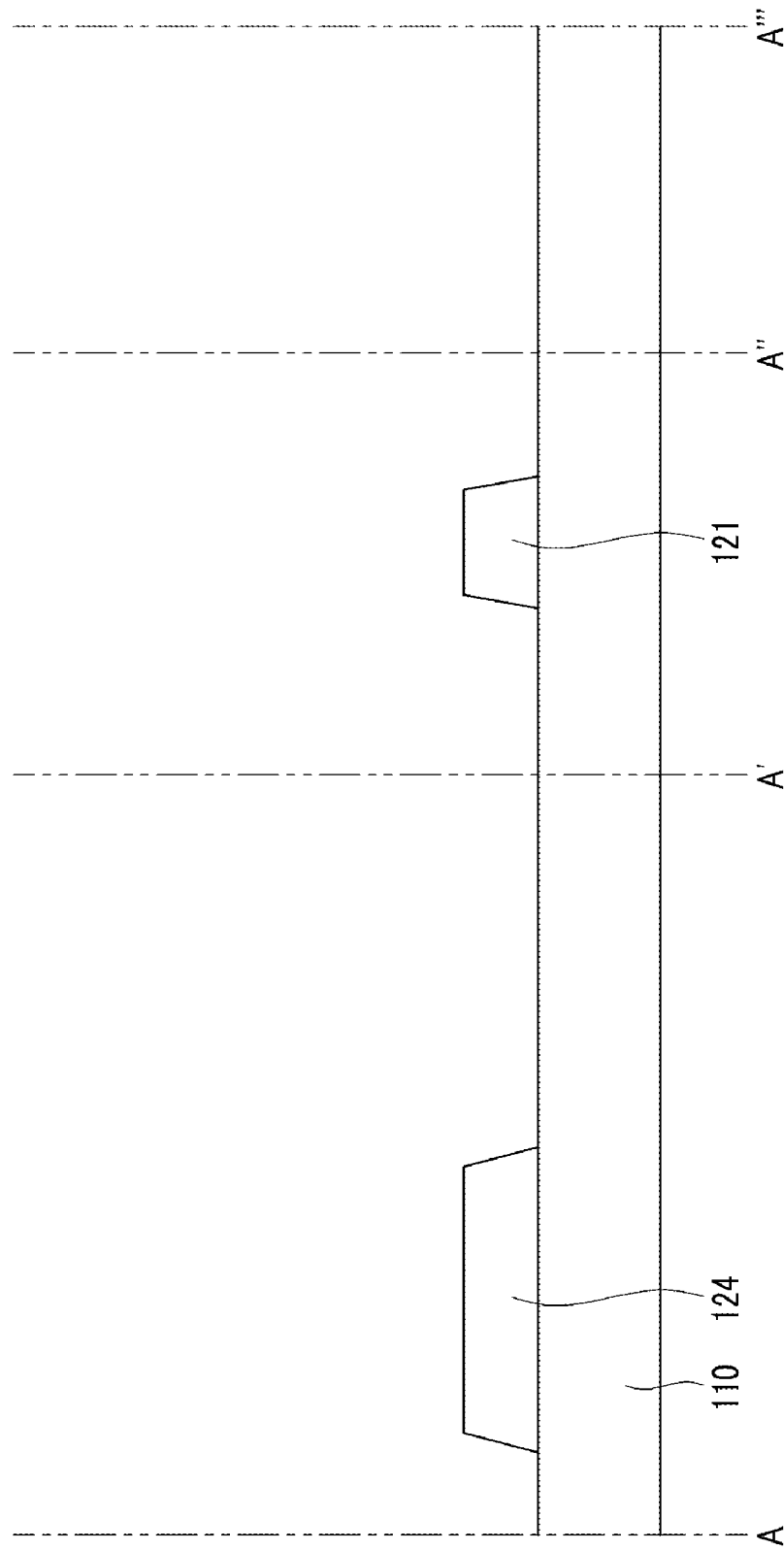
FIGS. 4, 6, 8, 10, 12, 14, and 16 are cross-sectional views of the exemplary TFT array panel taken along lines A-A', A'-A", and A"-A'" of FIGS. 3, 5, 7, 9, 11, 13, and 15.

As shown in FIGS. 3 and 4, a gate line 121 and a gate electrode 124 that are made of aluminum (Al), copper (Cu), or alloys thereof and that have a thickness of about 0.5 μm to about 5 μm are formed or otherwise disposed on a substrate 110. Because the gate line 121 is thick, when forming the gate line 121, the insulation substrate 110 may be deformed, and in order to prevent this, a buffer layer (see 115 of FIG. 33) that is made of silicone nitride (SiNx) may be additionally formed or otherwise disposed between the insulation substrate 110 and the gate line 121.

Figure 5:
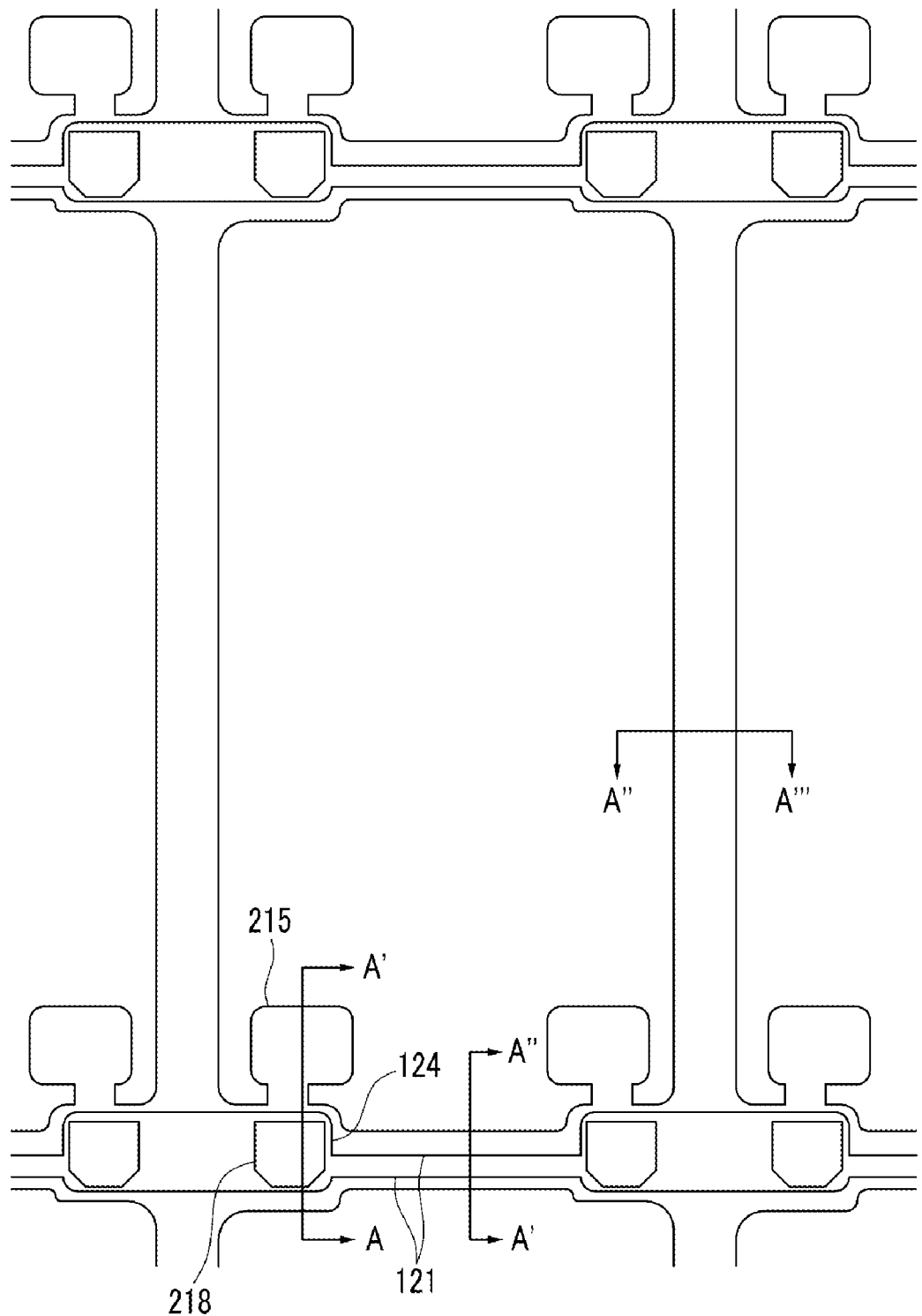
Figure 6:
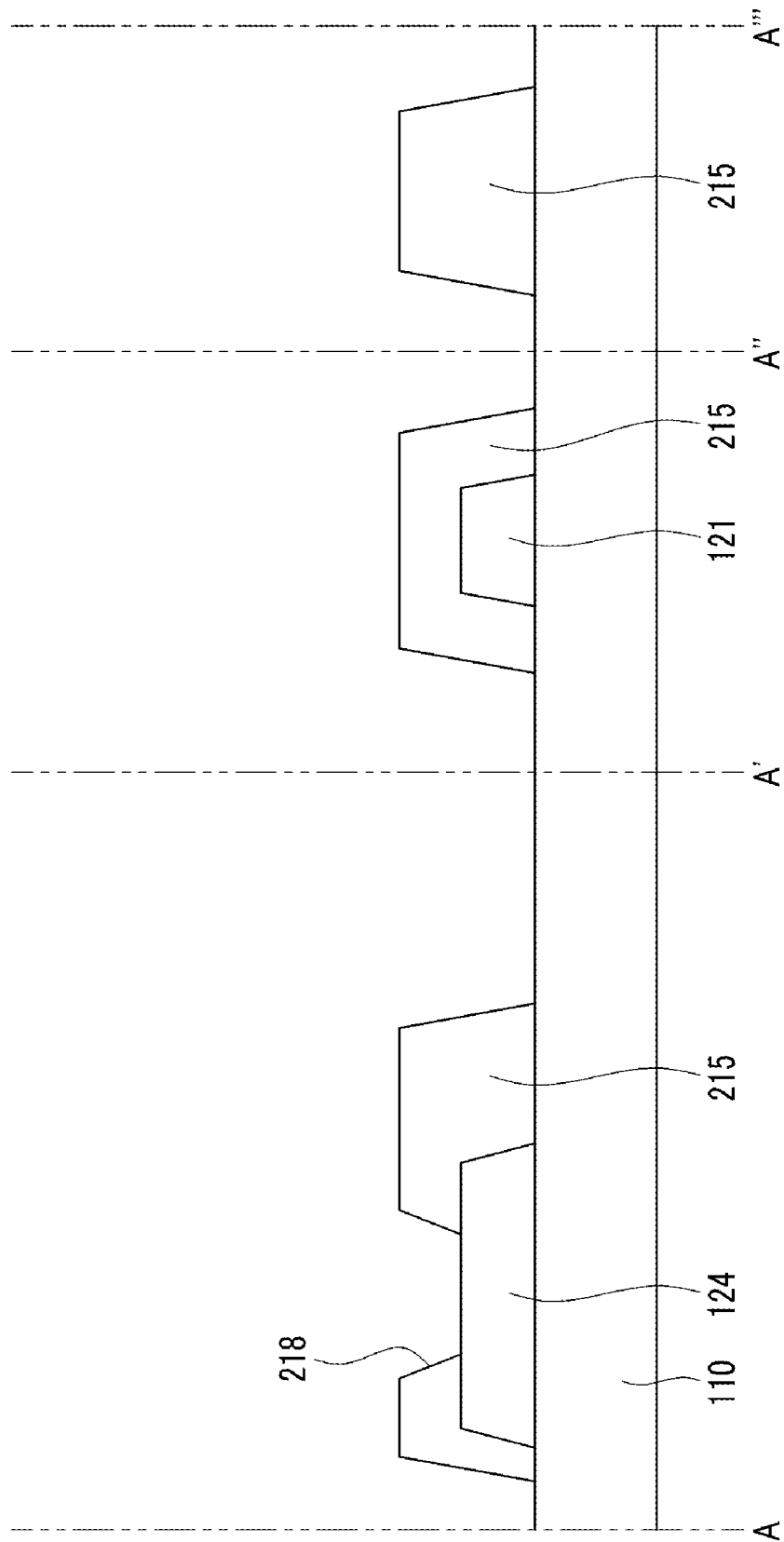

Next, as shown in FIGS. 5 and 6, a barrier rib 215 that divides a horizontal part that is formed along the gate line 121 and adjacent pixels in a horizontal direction and that includes a vertical part that is formed at a position at which a data line is to be formed and a contact part that is formed at a position at which a pixel electrode and a drain electrode are connected is formed or otherwise disposed. The barrier rib 215 may have a thickness of about 0.5 μm to about 10 μm using an organic material, and partitions a region where a color filter is to be disposed. The barrier rib 215 may have a height of about 1 μm to about 4 μm from the gate line 121, and because the barrier rib 215 is etched on the gate electrode 124, the barrier rib 215 has a thin thickness or is completely etched in an area of the gate electrode 124, and thus the gate electrode 124 may be exposed, such as through opening 218 in the barrier rib 215. When forming the barrier rib 215, it is preferable to expose and develop using a mask, and because a transflective region or a slit pattern is formed in a mask portion corresponding to the gate electrode 124, all patterns of the barrier rib 215 may be formed together by exposure and development at one time. The barrier rib 215 that is made of an organic material is inclined to a surface of the substrate 110, and a tilt angle thereof is preferably about 50° to about 120°. Further, as an organic material that forms the barrier rib 215, an organic material having a low dielectric constant of about 3.5 or less, or an organic material to which at least one material of a surfactant, a silicon (Si)-based material, and a fluorine (F)-based material is added may be used. Further, through adjusting an additive (fluorine, etc.) that is added to a material that forms an organic film, or through surface treatment after forming the barrier rib 215 with an organic film, the profile of the barrier rib 215 can be adjusted.

Figure 7:
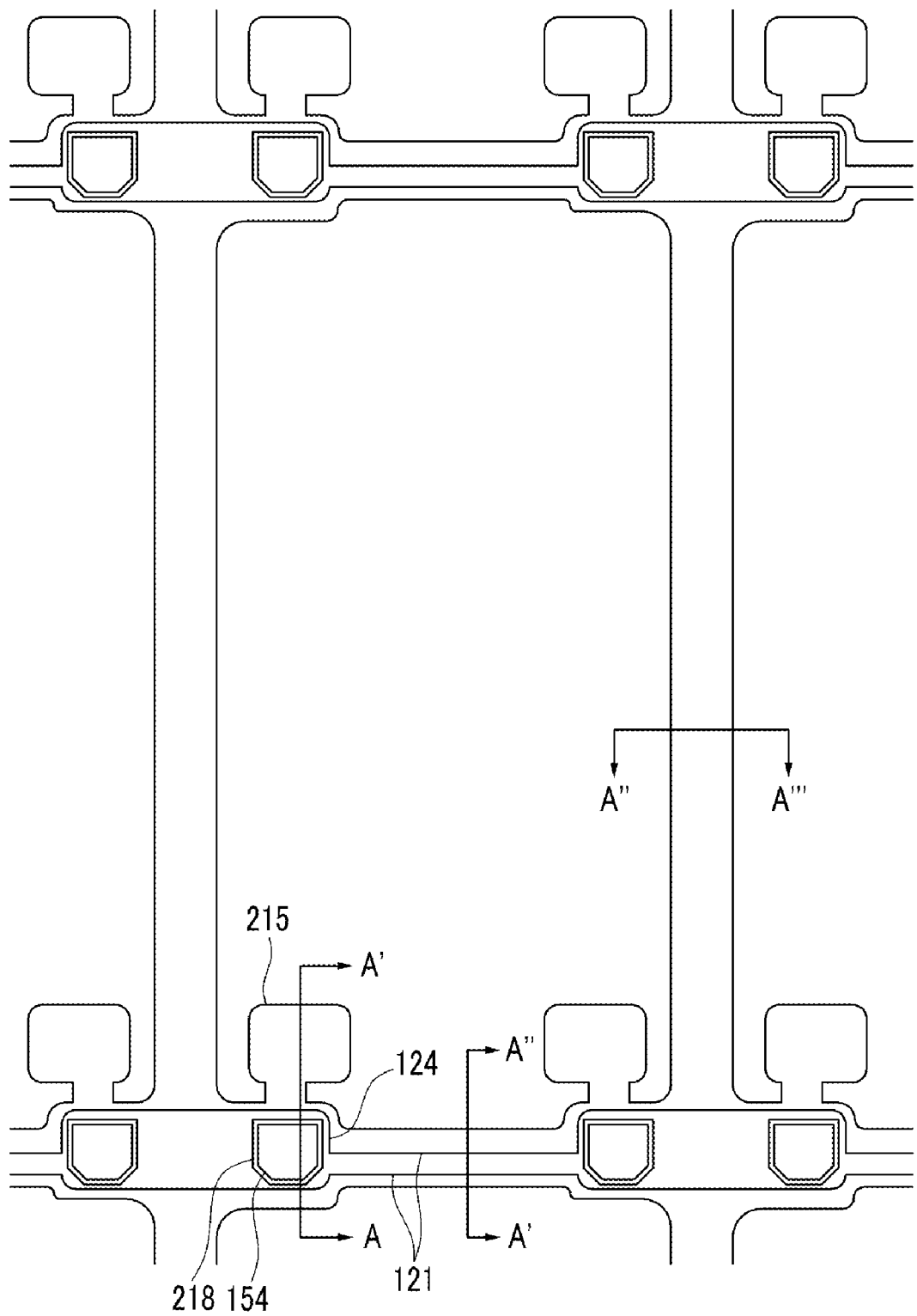
Figure 8:
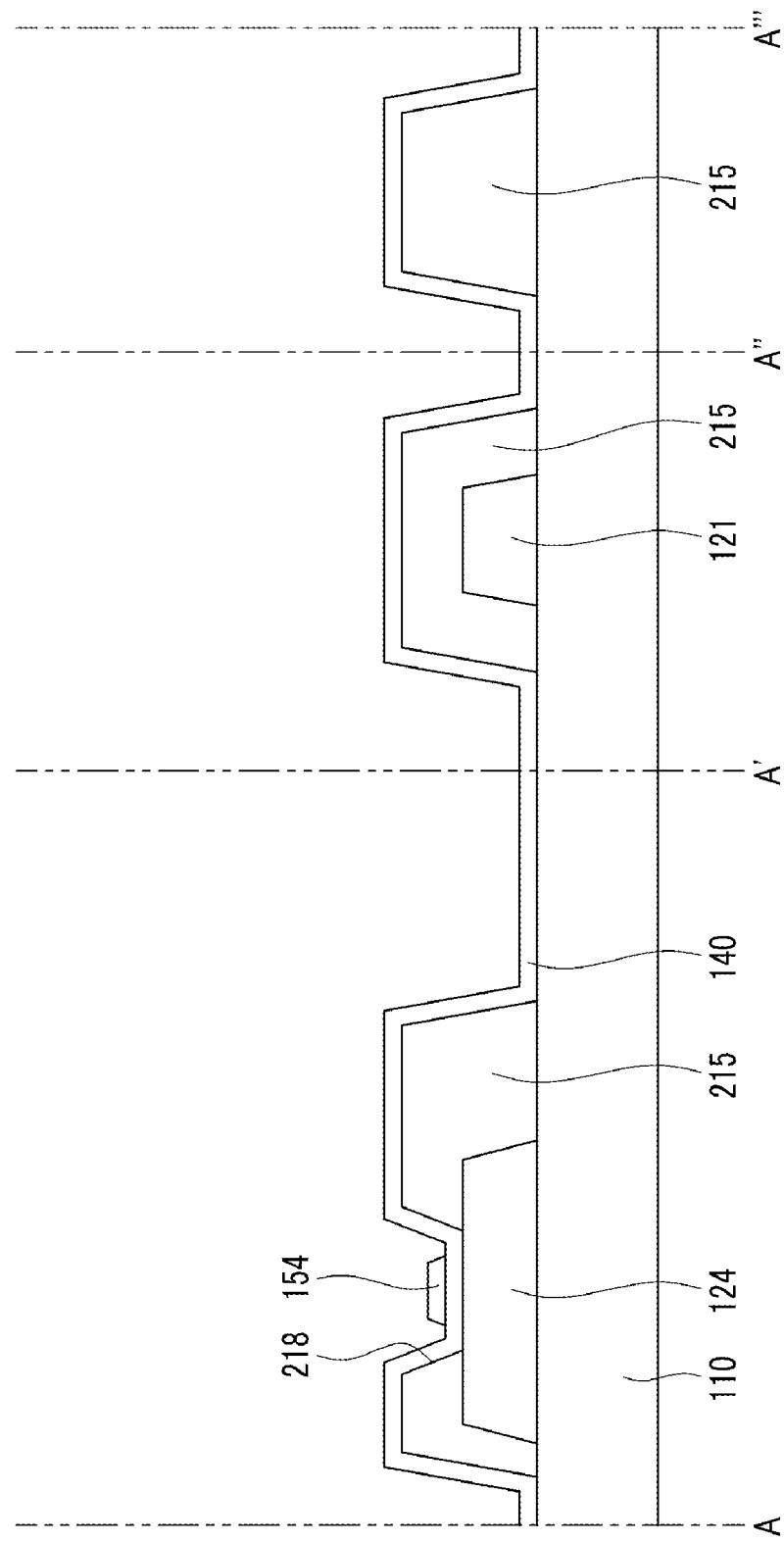

Next, as shown in FIGS. 7 and 8, after forming or disposing a gate insulating layer 140 at about 0.3 μm to about 3 μm in an entire region of the substrate 110, a semiconductor 154 is formed or otherwise disposed on the gate electrode 124 on an upper part of the gate insulating layer 140. As shown in FIG. 8, the semiconductor 154 may be disposed at a lower height than that of the barrier rib 215.

Figure 9:
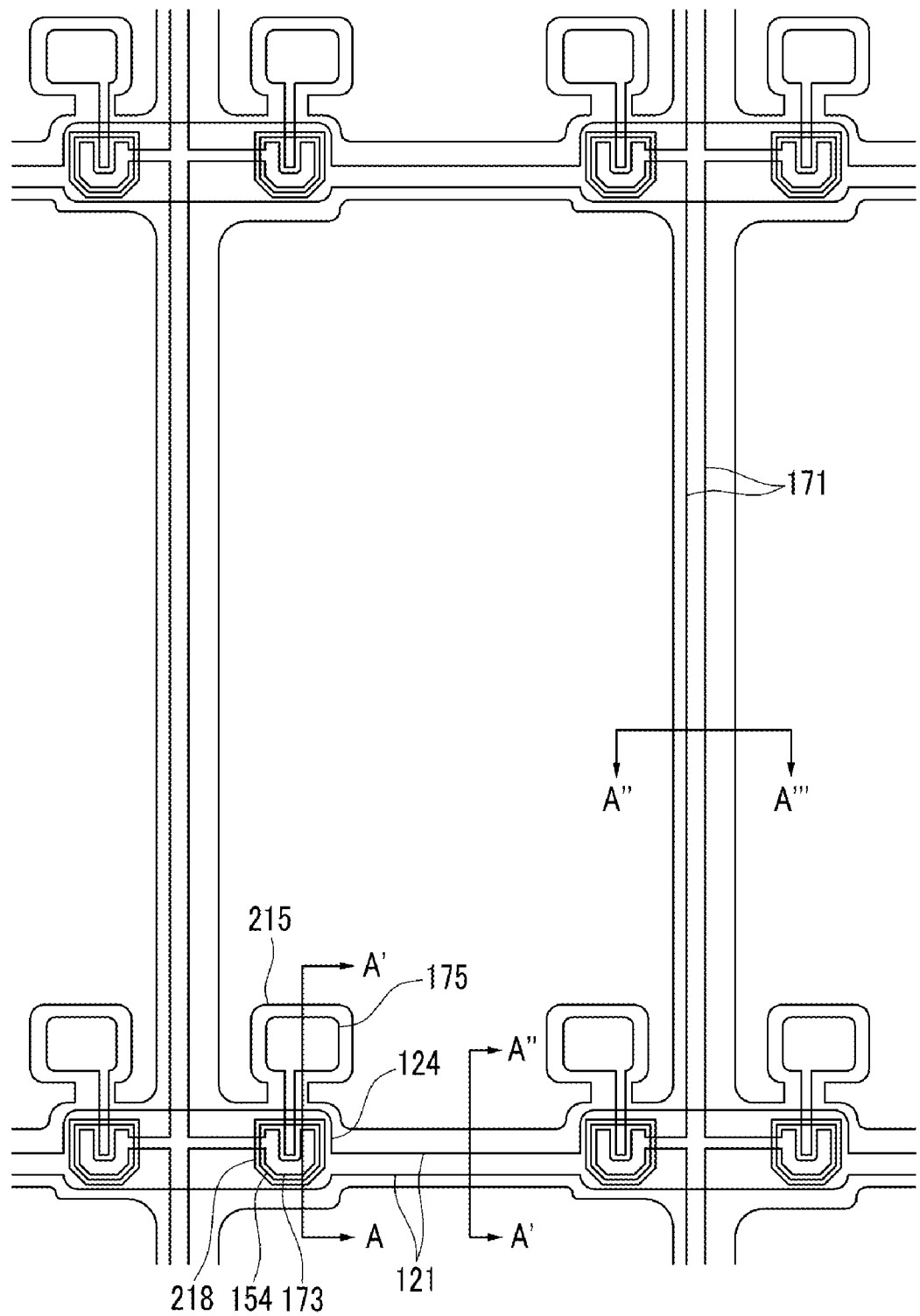
Figure 10:
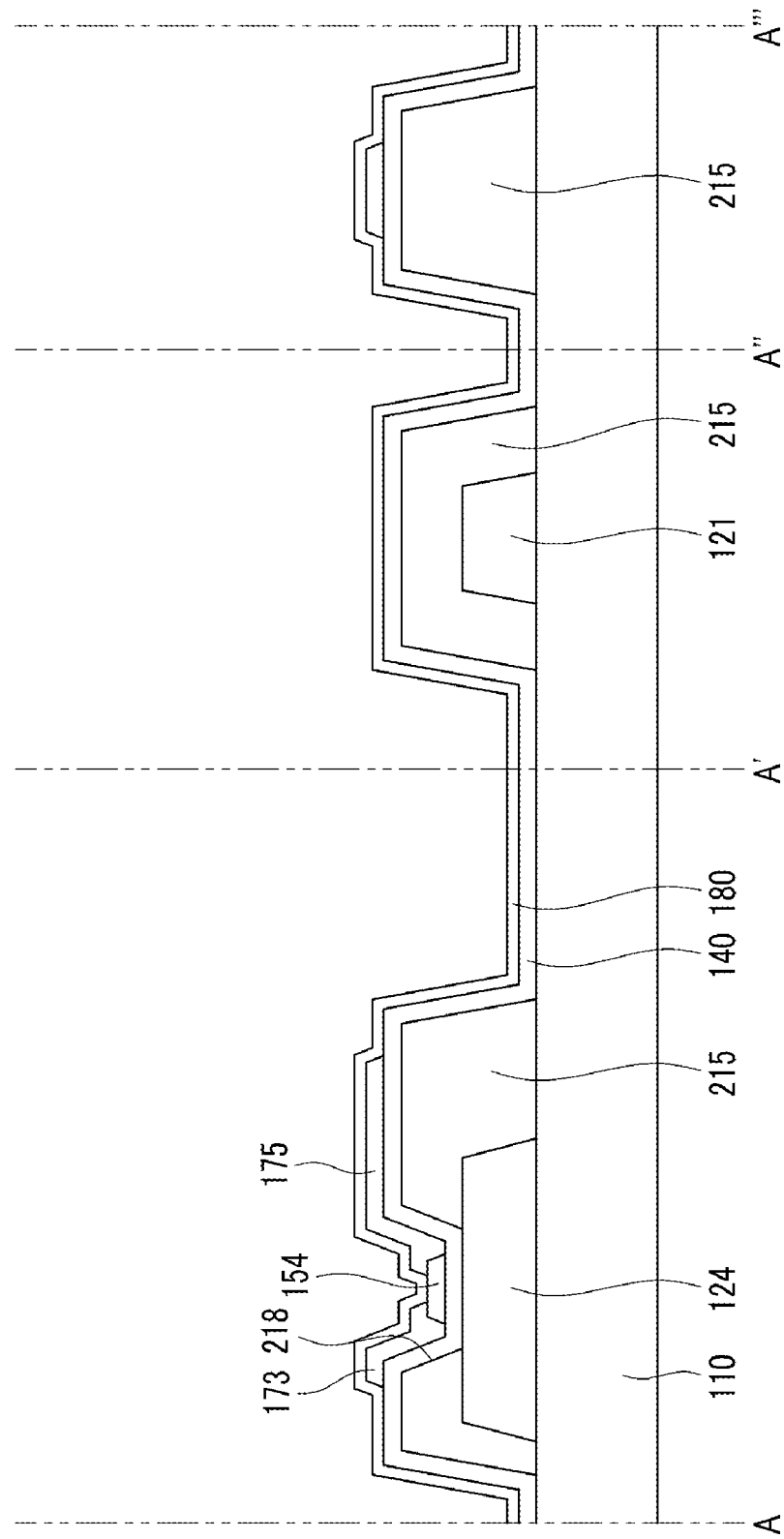

Next, as shown in FIGS. 9 and 10, a data line 171 including a source electrode 173 and a drain electrode 175 are formed or otherwise disposed on the TFT array panel. An ohmic contact layer (not shown) may first be formed, prior to the data line 171 and the drain electrode 175, such that an ohmic contact is provided between an upper part of the semiconductor 154 and the source electrode 173 and the drain electrode 175.

Figure 11:
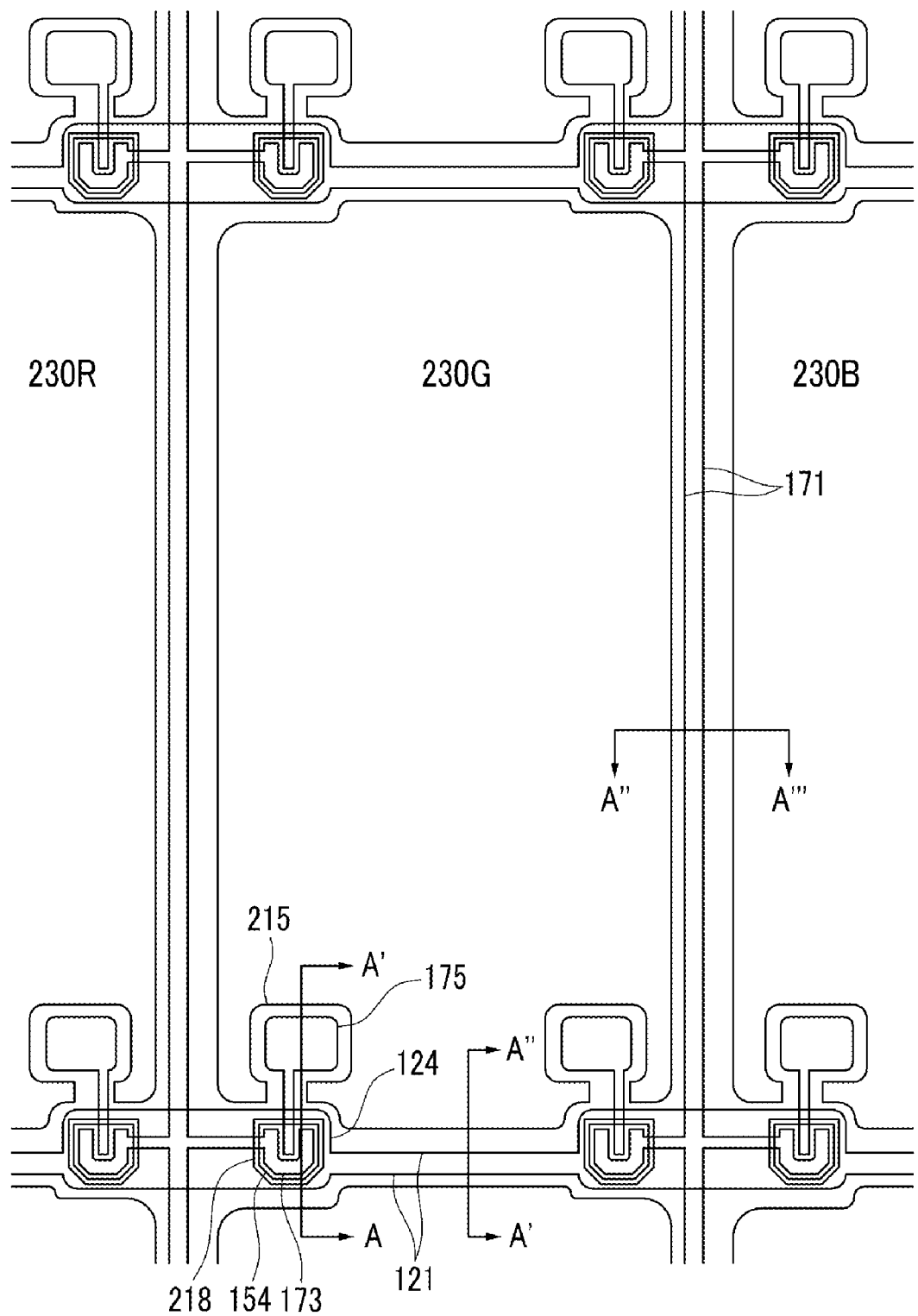
Figure 12:
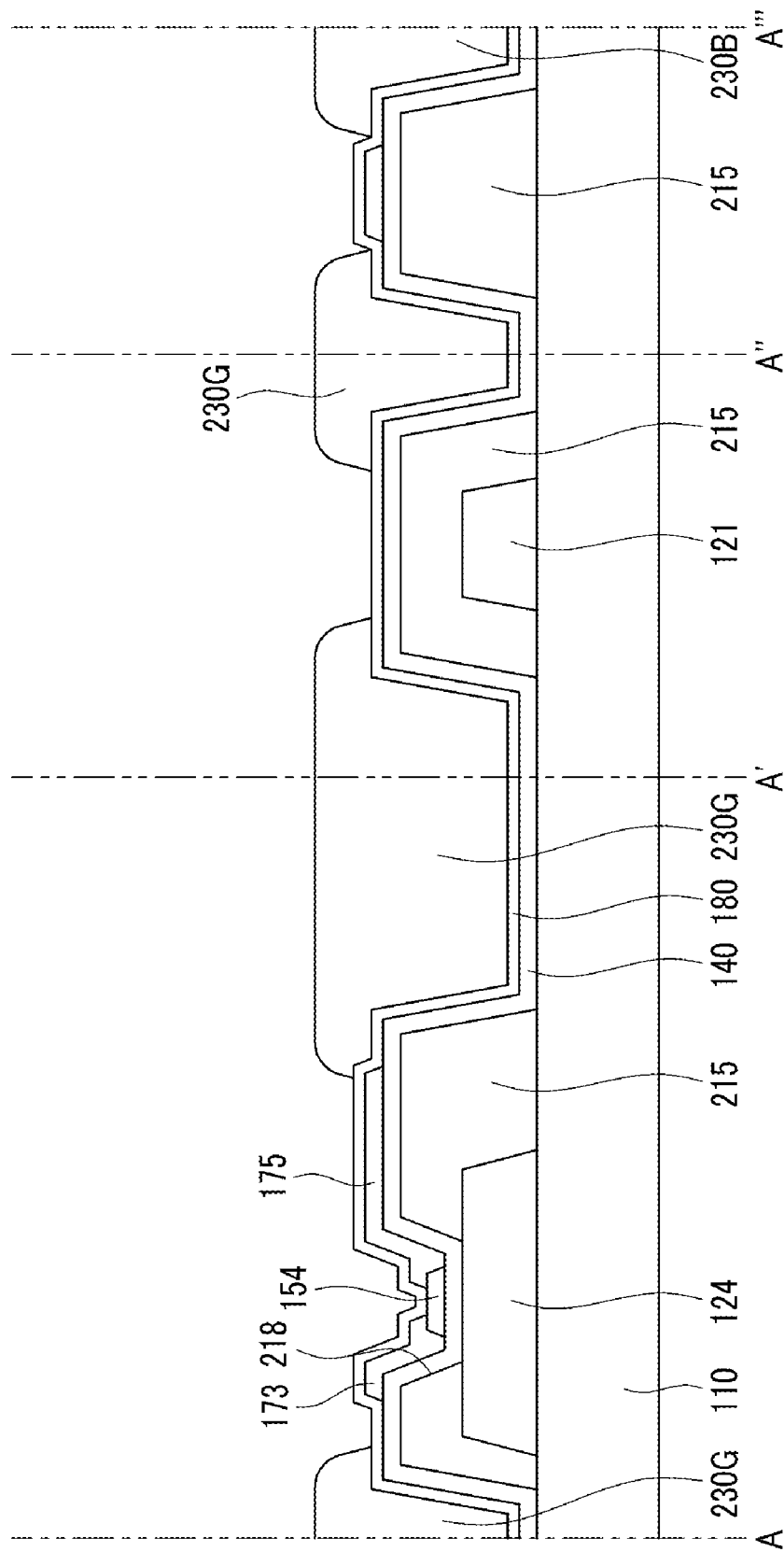

Next, as shown in FIGS. 11 and 12, after a passivation layer 180 is made of an inorganic insulating material in an entire region of the substrate 110, a color filter 230 is formed with an Inkjet method about a region where the barrier rib 215 is not disposed. In an exemplary embodiment, a red color filter 230R, a green color filter 230G, and a blue color filter 230B are formed. The color filter 230 of each color is formed in different processes, and because the barrier rib 215 has a high height and a great taper angle, the color filter 230 is uniformly formed. The color filter 230 is formed in a thickness of about 1 μm to about 4 μm. Further, FIG. 12 illustrates a structure in which the color filter 230 is formed higher than the barrier rib 215, but heights of the color filter 230 and the barrier rib 215 are not limited thereto, and the color filter 230 may have a lower height or the same height as that of the barrier rib 215. Further, it is preferable that a thickness difference between the color filter 230 and the barrier rib 215 is about 2 μm or less.

Figure 13:
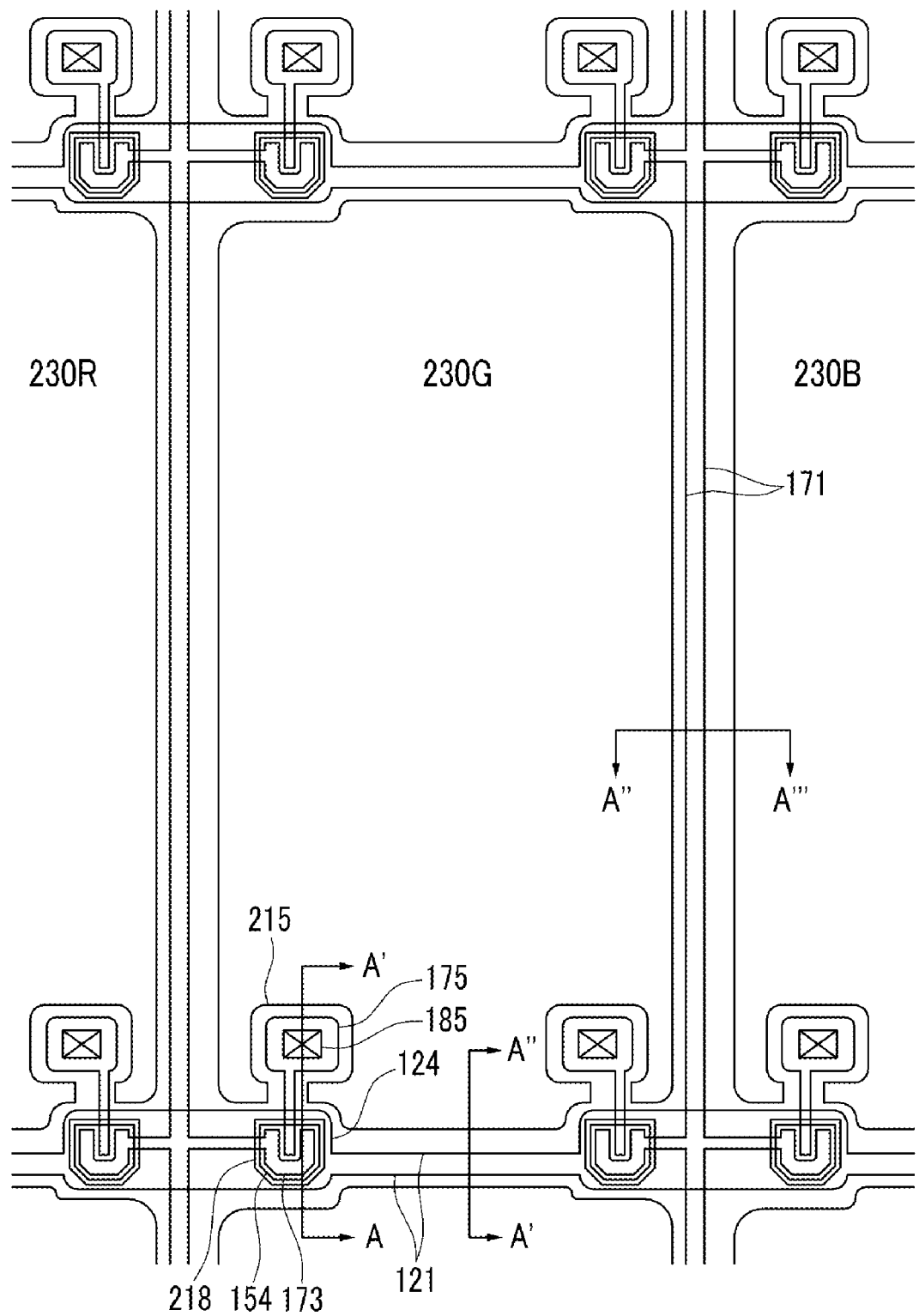
Figure 14:
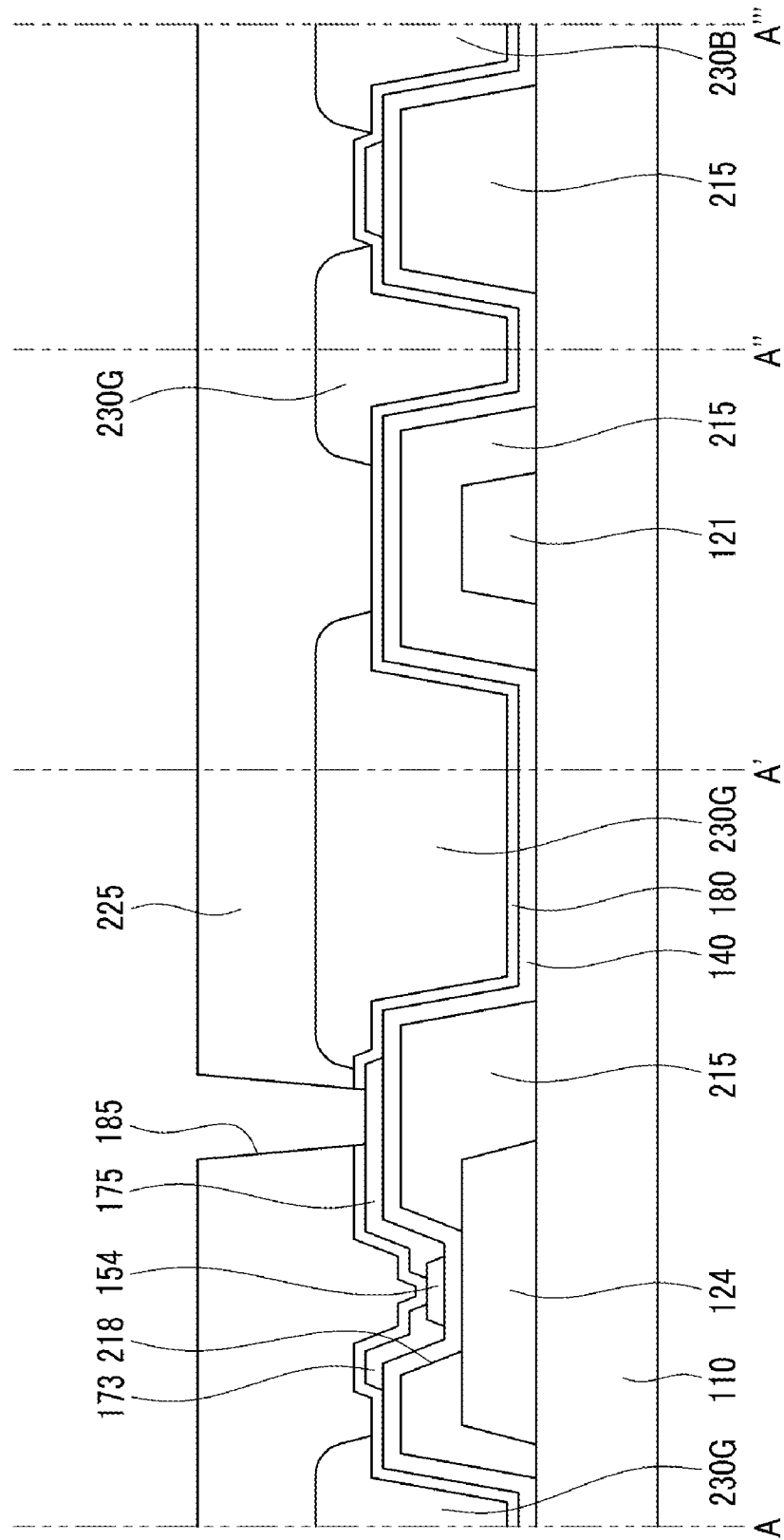

Next, as shown in FIGS. 13 and 14, an organic capping layer 225 having a thickness of about 1 μm to about 5 μm is formed or otherwise disposed on the passivation layer 180 and the color filter 230, and a contact hole 185 is formed by removing the passivation layer 180 and the organic capping layer 225 that are formed on the drain electrode 175. Here, the contact hole 185 may be formed with the following method. First, after removing the organic capping layer 225 in an area above the drain electrode 175 by exposing and developing, the passivation layer 180 in an area above the drain electrode 175 is dry-etched and removed. As a result, the drain electrode 175 is exposed to the outside.

Figure 15:
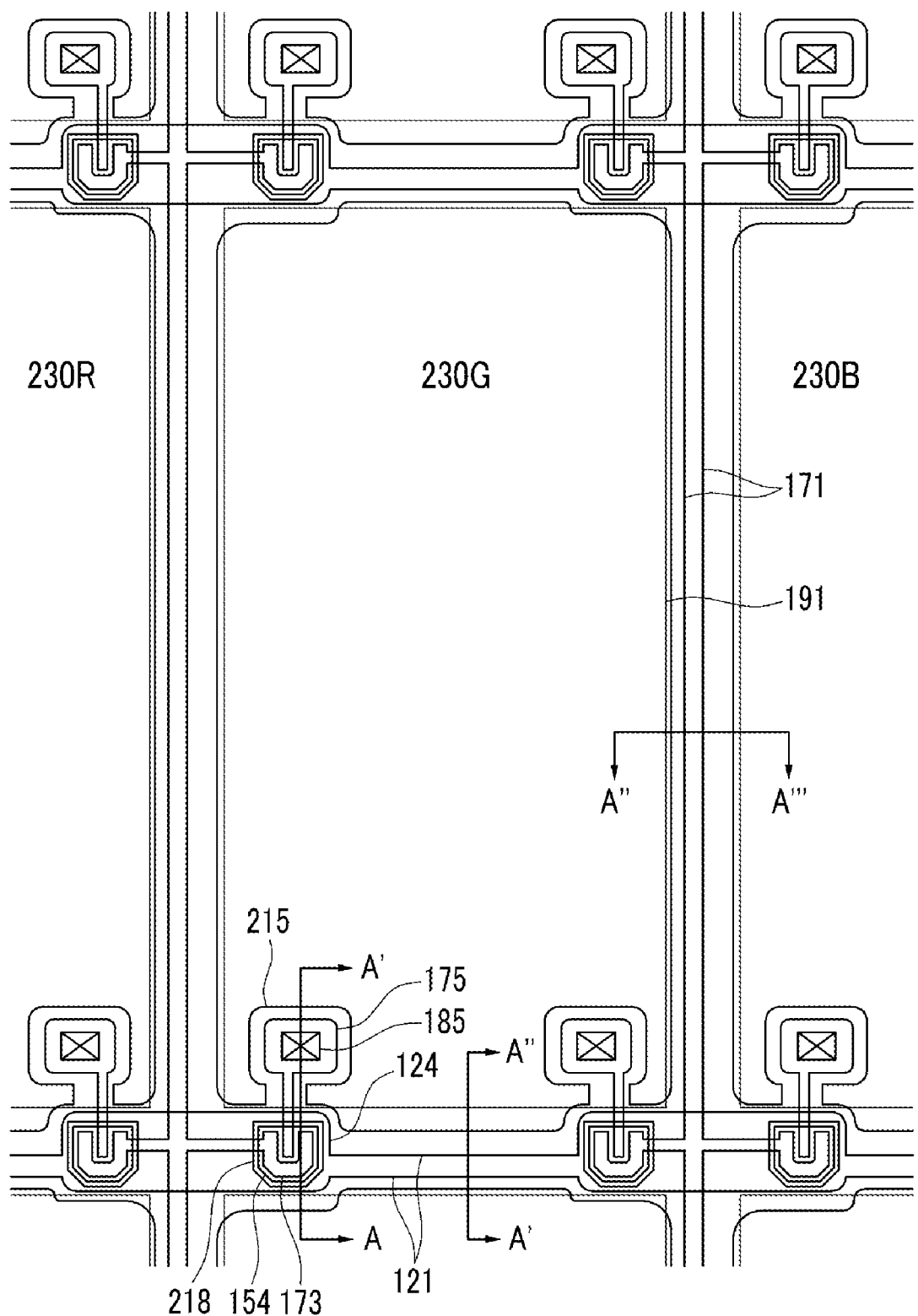
Figure 16:
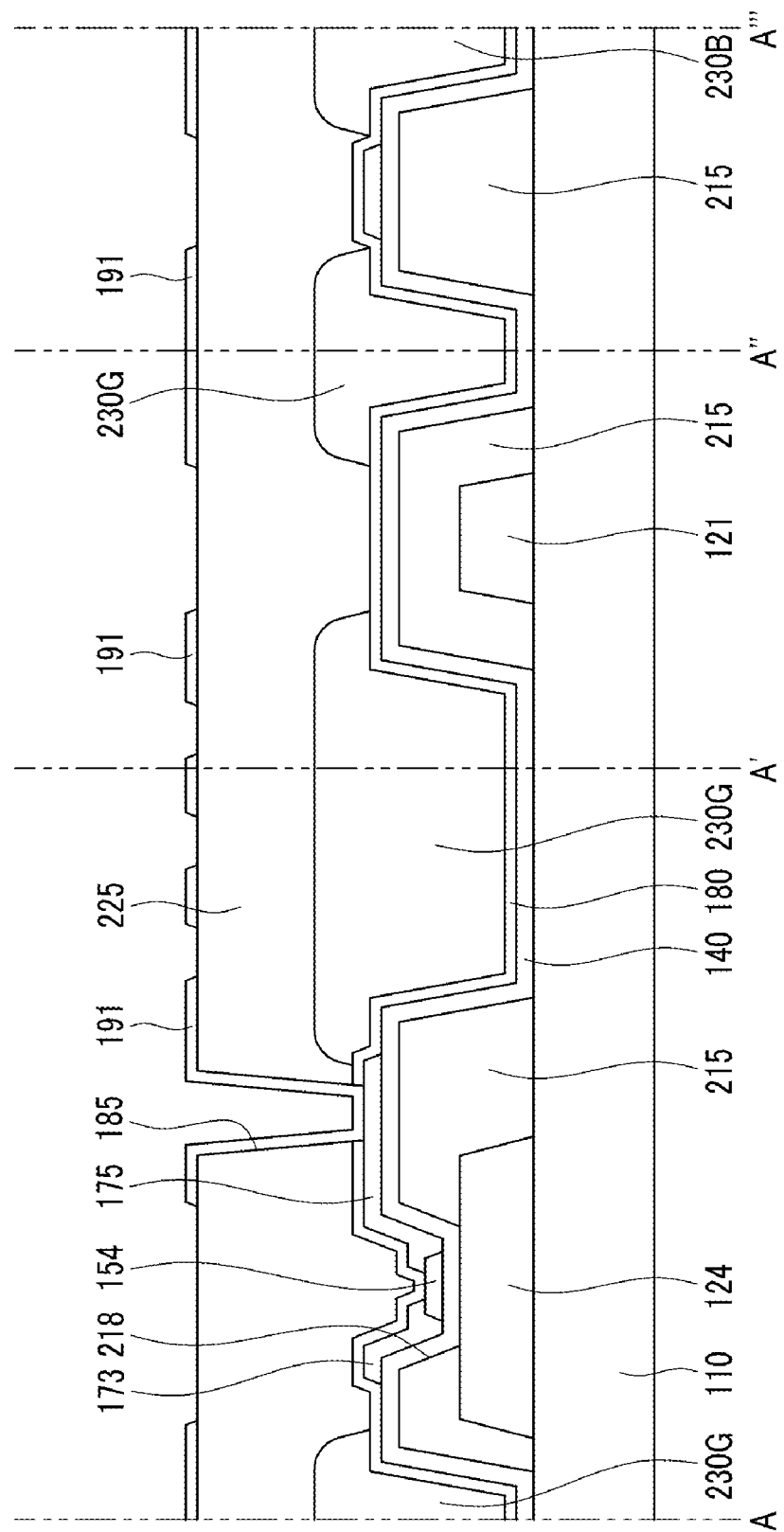

Next, as shown in FIGS. 15 and 16, a pixel electrode 191 is formed on the organic capping layer 225. A TFT array panel according to an exemplary embodiment of the present invention may have two TFTs per pixel, and may include two subpixel electrodes that are connected to two TFTs, respectively. In such an exemplary embodiment, the two subpixel electrodes are electrically insulated from each other and may include a micro-slit pattern. A structure of each subpixel electrode is described in FIG. 34.

Next, as shown in FIGS. 1 and 2, a light blocking member 220 is formed on the organic capping layer 225 and may cover portions, such as edge portions, of the pixel electrode 191. The light blocking member 220 is formed in an upper part of a position at which the barrier rib 215 is formed, such that the light blocking member 220 overlaps the barrier rib 215, and the light blocking member 220 has a wider width than that of the barrier rib 215. Further, the light blocking member 220 may be formed to have different heights, and a light blocking member 220 having a higher height may perform a function of a spacer for uniformly sustaining a gap of upper and lower substrates, such as between the TFT array panel and an opposing common electrode panel, where a liquid crystal layer may be interposed in the gap between the TFT array panel and the common electrode panel.

In the foregoing description, a TFT array panel and a method of manufacturing the same according to an exemplary embodiment of the present invention were described with reference to FIGS. 1 to 16. In the foregoing exemplary embodiment, a structure in which one source electrode/drain electrode/pixel electrode may be formed in one pixel is illustrated, however a structure in which two source electrodes/drain electrodes/pixel electrodes may instead be formed in one pixel.

A TFT array panel for an exemplary LCD according to another exemplary embodiment of the present invention is described in detail with reference to FIGS. 17 to 20.

Figure 17:
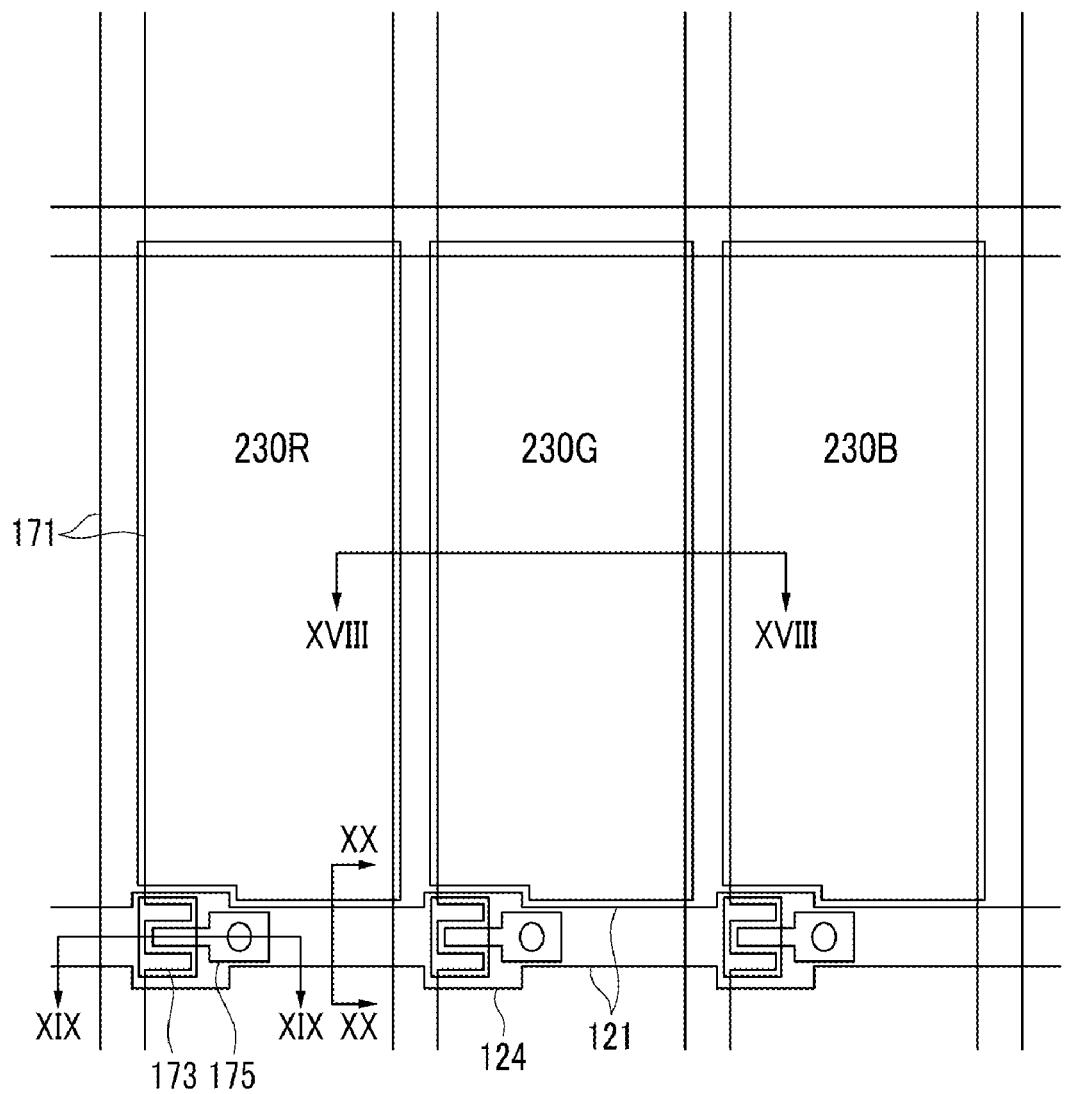
FIG. 17 is a layout view of an exemplary TFT array panel for an exemplary LCD according to another exemplary embodiment of the present invention.
Figure 18:
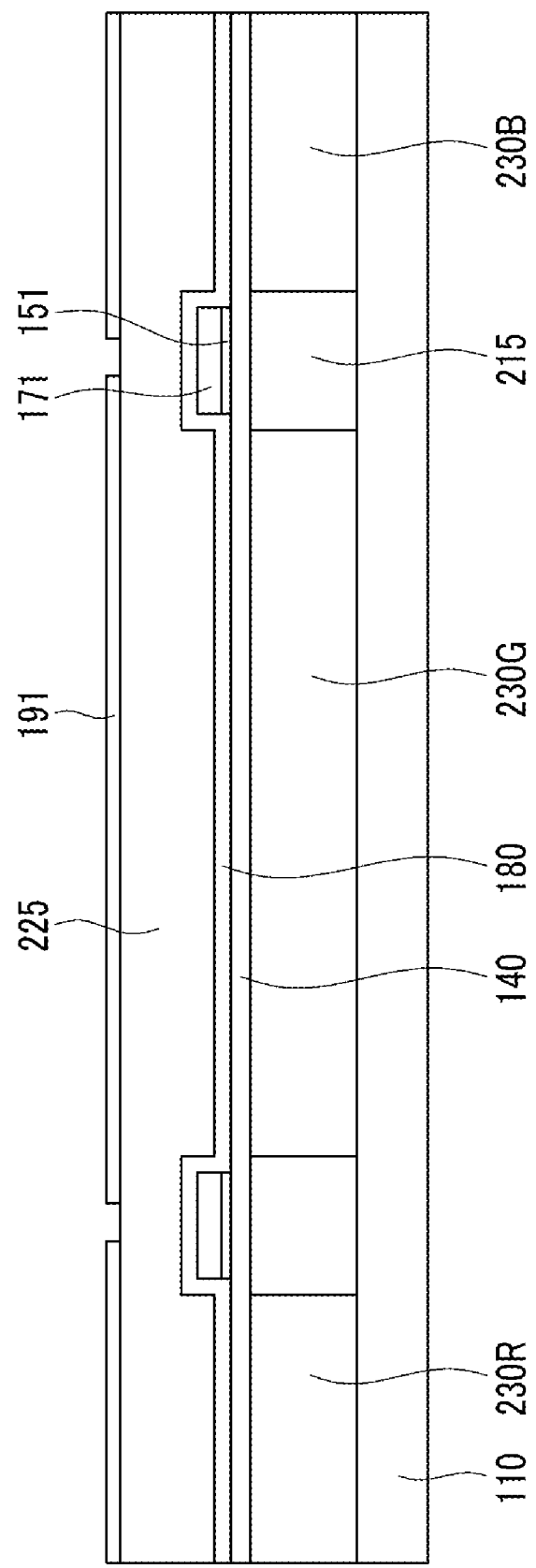
FIG. 18 is a cross-sectional view of the exemplary TFT array panel taken along line XVIII-XVIII of FIG. 17.
Figure 19:
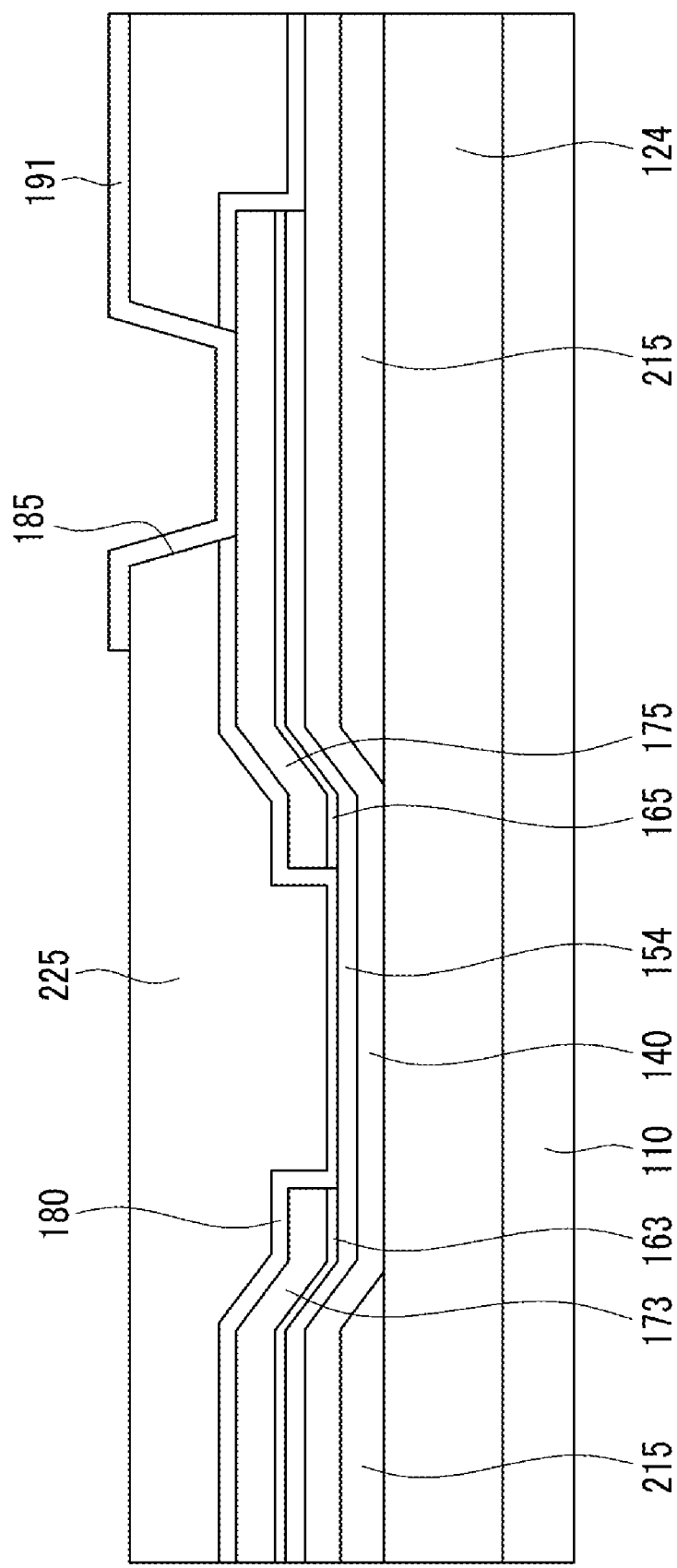
FIG. 19 is a cross-sectional view of the exemplary TFT array panel taken along line XIX-XIX of FIG. 17.
Figure 20:
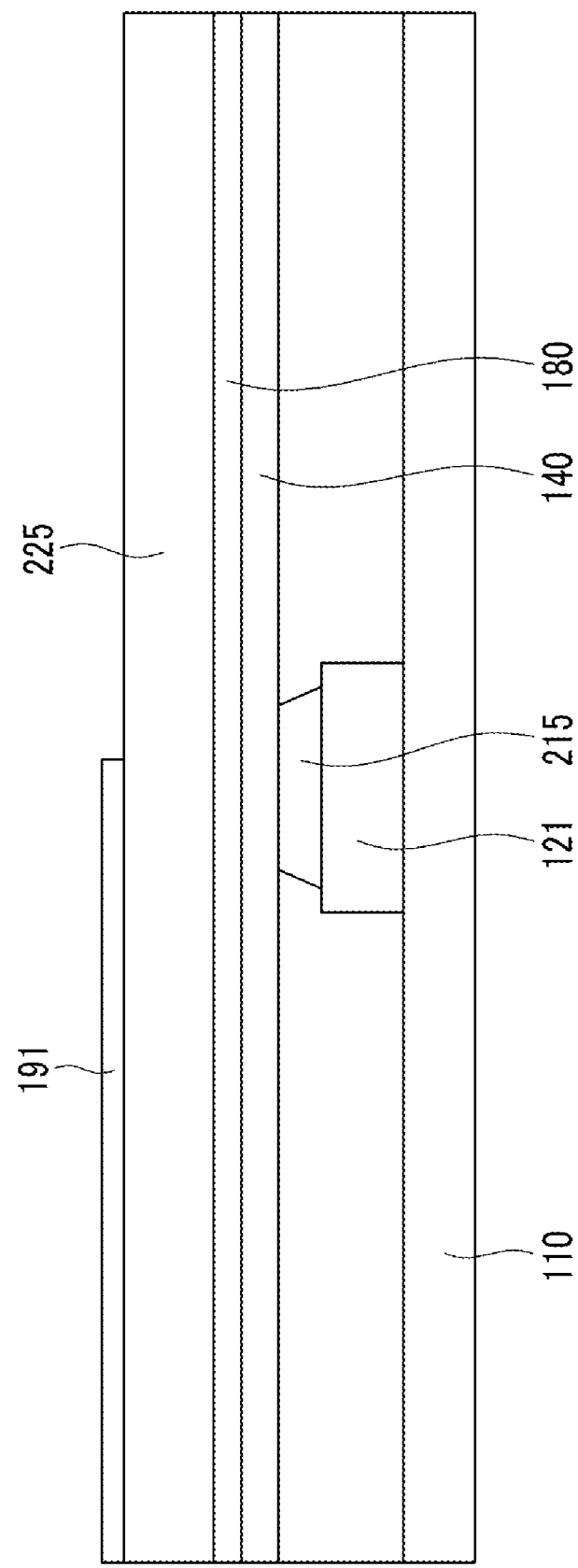
FIG. 20 is a cross-sectional view of the exemplary TFT array panel taken along line XX-XX of FIG. 17.

FIG. 17 is a layout view of an exemplary TFT array panel for an exemplary LCD according to another exemplary embodiment of the present invention, FIG. 18 is a cross-sectional view of the exemplary TFT array panel taken along line XVIII-XVIII of FIG. 17, FIG. 19 is a cross-sectional view of the exemplary TFT array panel taken along line XIX-XIX of FIG. 17, and FIG. 20 is a cross-sectional view of the exemplary TFT array panel taken along line XX-XX of FIG. 17.

In a TFT array panel according to another exemplary embodiment of the present invention that is shown in FIG. 17, one TFT is formed in one pixel and one pixel electrode is formed, and when forming a source electrode and a drain electrode, a semiconductor and an ohmic contact layer are patterned together. Further, color filters 230 are stacked in a lower part of the gate insulating layer 140, that is, color filters 230 may be disposed between the insulation substrate 110 and the gate insulating layer 140. This is described in detail hereinafter.

A plurality of gate lines 121 are formed or otherwise disposed on an insulation substrate 110 that is made of transparent glass, plastic, or so on.

The gate lines 121 transfer a gate signal and generally extend in a horizontal direction, such as a first direction. Each gate line 121 includes a wide end part (not shown) for connecting a plurality of gate electrodes 124 that are vertically protruded from the gate line 121 to other layers or an external driving circuit.

The gate line 121 is formed with aluminum (Al), copper (Cu), or alloys thereof, and may have a thickness of about 0.5 μm to about 5 μm. Because the gate line 121 is very thick, when forming the gate line 121, the insulation substrate 110 may be deformed, and in order to prevent this, a buffer layer (see 115 of FIG. 33) that is made of silicone nitride (SiNx), etc., may be additionally formed or otherwise disposed between the insulation substrate 110 and the gate line 121. As a thickness of the gate line 121 increases, RC delay of a signal flowing in the gate line 121 decreases. Although particular materials are described for the gate line 121, the gate line 121 may be made of various metals or conductors, and the present invention is characterized in that the gate line 121 is formed in an increased thickness.

A side surface of the gate line 121 is inclined to a surface of the substrate 110, and a tilt angle thereof is preferably about 30° to about 80°.

A barrier rib 215 that is made of an organic material having a dielectric constant of about 3.5 or less is formed or otherwise disposed on the gate line 121. The barrier rib 215 divides a horizontal part that is formed along the gate line 121 and adjacent pixels in a horizontal direction, includes a vertical part that is formed at a position at which a data line is to be formed and a contact part that is formed at a position at which a pixel electrode and a drain electrode are connected are formed, and partitions a region where a color filter is to be formed or otherwise disposed. The barrier rib 215 has a narrower width than that of the gate line 121. In other words, a footprint or periphery of the barrier rib 215 lies within a footprint or periphery of the gate line 121. Further, the barrier rib 215 has a thickness of about 0.5 μm to about 10 μm and has a height of about 1 μm to about 4 μm from the gate line 121, and because the barrier rib 215 is etched on the gate electrode 124, the barrier rib 215 is formed in a thin thickness. According to exemplary embodiments, as the entire barrier rib 215 is etched on a portion overlapping the gate electrode, the gate electrode 124 may be exposed through an opening in the barrier rib 215. The barrier rib 215 that is made of an organic material is inclined to a surface of the substrate 110, and a tilt angle thereof may be about 50° to about 120°. Here, a tilt angle of more than 90° illustrates an inverse taper structure. Further, as an organic material that forms the barrier rib 215, an organic material having a low dielectric constant of about 3.5 or less, an organic material to which at least one material of a surfactant, a silicon (Si)-based material, and a fluorine (F)-based material is added may be used. Further, through adjusting an additive (fluorine, etc.) that is added to a material that forms an organic film, or through surface treatment after forming the barrier rib 215 with an organic film, a profile of the barrier rib 215 can be adjusted.

A color filter 230 is formed with an Inkjet method in a region where the barrier rib 215 is not formed, as shown in FIG. 18. The color filter 230 includes at least three colors, such as primary colors (for example, red, green, and blue), and uses different pigments for each color. In an exemplary embodiment, a red color filter 230R, a green color filter 230G, and a blue color filter 230B may be included. In this case, because the barrier rib 215 has a high height, the color filter 230 is fully filled within the barrier rib 215, and because the barrier rib 215 has a great taper angle, the color filter 230 may be uniformly formed. The color filter 230 is formed in a thickness of about 1 μm to about 4 μm. Further, in FIG. 18, the color filter 230 has the same height as that of the barrier rib 215, but heights of the color filter 230 and the barrier rib 215 are not limited thereto, and the color filter 230 may have a height that is lower or higher than that of the barrier rib 215. Further, it is preferable that a thickness difference between the color filter 230 and the barrier rib 215 is about 2 μm or less.

A gate insulating layer 140 that is made of silicon nitride (SiNx) or silicon oxide (SiOx) is formed on the barrier rib 215 and the color filter 230. According to exemplary embodiments, the gate insulating layer 140 may have various thicknesses within about 0.3 μm to about 3 μm.

A plurality of semiconductor stripes 151 that are made of hydrogenated amorphous silicon ("a-Si"), polysilicon, or so on are formed on the gate insulating layer 140. The semiconductor stripes 151 generally extend in a vertical direction, a second direction substantially perpendicular to the first direction, and include a plurality of projections 154 that are extended toward the gate electrode 124. A plurality of ohmic contact stripes and islands 161 and 165 are formed on the semiconductors 151. The ohmic contacts 161 and 165 may be made of a material such as n+ hydrogenated a-Si in which n-type impurities such as phosphorus are doped with a high concentration, or may be made of silicide. Each ohmic contact stripe 161 has a plurality of projections 163, and the projections 163 and the ohmic contact islands 165 are formed in pairs and are disposed on the projections 154 of the semiconductors 151.

Side surfaces of the semiconductors 151 and the ohmic contacts 161 and 165 are also inclined to a surface of the substrate 110, and in an exemplary embodiment, a tilt angle thereof is about 30° to about 80°.

A plurality of data lines 171 and a plurality of drain electrodes 175 are formed on the semiconductors 151 and the gate insulating layer 140.

The data lines 171 transfer a data signal and generally extend in a vertical direction, the second direction, and intersect the gate lines 121. Each data line 171 overlaps a vertical part of the barrier rib 215. Each data line 171 includes a wide end part (not shown) for connecting a plurality of source electrodes 173 that are extended toward the gate electrode 124 to other layers or an external driving circuit.

The drain electrode 175 is separated from the data line 171 and is positioned opposite to the source electrode 173 above the gate electrode 124. Each drain electrode 175 may include one wide end part and a bar-shaped end part. In such an embodiment, the wide end part is formed on a contact part of the barrier rib 215, and a part of the bar-shaped end part is surrounded by the bent source electrode 173.

One gate electrode 124, one source electrode 173, and one drain electrode 175 together with the semiconductor 154 form one TFT, and a channel of the TFT exists within a region where a portion of the barrier rib 215 is removed, and the channel is formed in the semiconductor 154 between the source electrode 173 and the drain electrode 175.

The data line 171 and the drain electrode 175 may be formed in a structure of a single layer, a dual layer, or a triple layer with various metals, and it is preferable that side surfaces of the data line 171 and the drain electrode 175 are inclined with a tilt angle of about 30° to about 80° relative to a surface of the substrate 110.

Ohmic contacts 161, 163, and 165 are disposed between the semiconductor 151 and the data line 171 and drain electrode 175, and lower contact resistance therebetween.

A passivation layer 180 is formed on the data line 171, the drain electrode 175, and the exposed portion of the semiconductor 154, as well as on exposed portions of the gate insulating layer 140. The passivation layer 180 is made of an inorganic insulator such as silicon nitride and silicon oxide.

An organic capping layer 225 is formed on the passivation layer 180. A plurality of contact holes 185 that expose the drain electrode 175 are formed in a region corresponding to the drain electrode 175 in the organic capping layer 225 and the passivation layer 180. The organic capping layer 225 is formed in a thickness of about 1 µm to about 5 µm.

A plurality of pixel electrodes 191 are formed on the organic capping layer 225. The pixel electrodes 191 are also formed through the contact holes 185 so as to contact the drain electrodes 175. Although not shown, each pixel electrode 191 may include a micro-slit pattern. This is described in FIG. 34.

A light blocking member (not shown) is formed or otherwise disposed on the organic capping layer 225, and the light blocking member may be formed in an upper part of a position at which the barrier rib 215 is formed so as to overlap the barrier rib 215 and have a wider width than that of the barrier rib 215. In other words, a footprint or periphery of the barrier rib 215 lies within a footprint or periphery of the light blocking member 220. Further, the light blocking member may have different heights, and a light blocking member having a higher height performs a function of a spacer for sustaining a gap between an upper substrate and a lower substrate.

An exemplary method of manufacturing the exemplary TFT array panel that is shown in FIGS. 17 to 20 is described hereinafter in detail with reference to FIGS. 17 to 32.

FIGS. 21 to 24 are cross-sectional views in intermediate steps of an exemplary method of manufacturing the exemplary TFT array panel of FIG. 18, FIGS. 25 to 28 are cross-sectional views in intermediate steps of an exemplary method of manufacturing the exemplary TFT array panel of FIG. 19, and FIGS. 29 to 32 are cross-sectional views in intermediate steps of an exemplary method of manufacturing the exemplary TFT array panel of FIG. 20.

Figure 21:
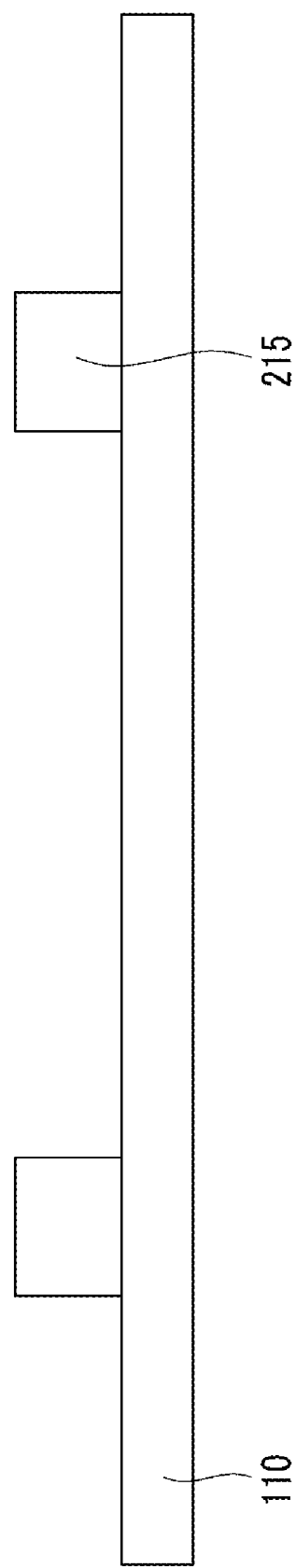
FIGS. 21 to 24 are cross-sectional views in intermediate steps of an exemplary method of manufacturing the exemplary TFT array panel of FIG. 18.
Figure 25:
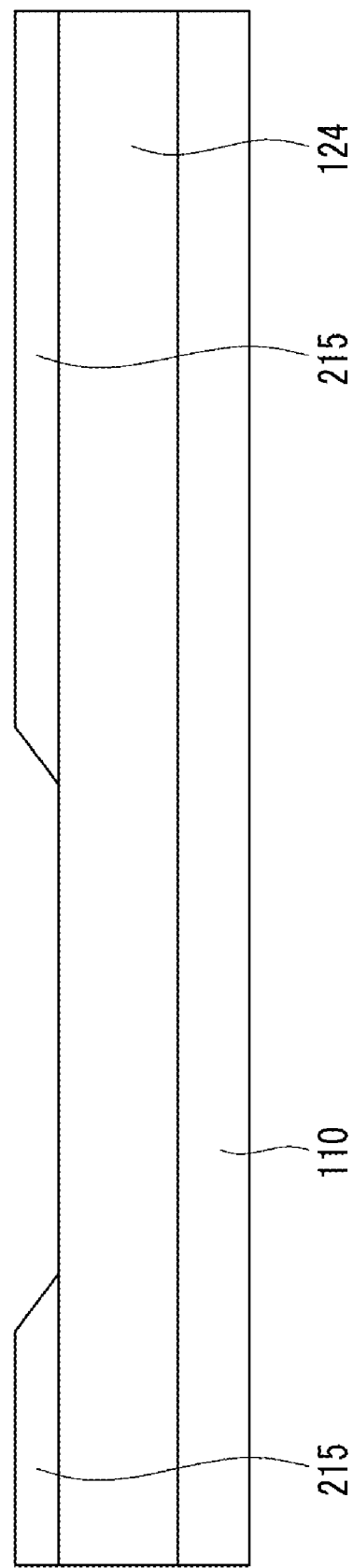
FIGS. 25 to 28 are cross-sectional views in intermediate steps of an exemplary method of manufacturing the exemplary TFT array panel of FIG. 19.
Figure 29:
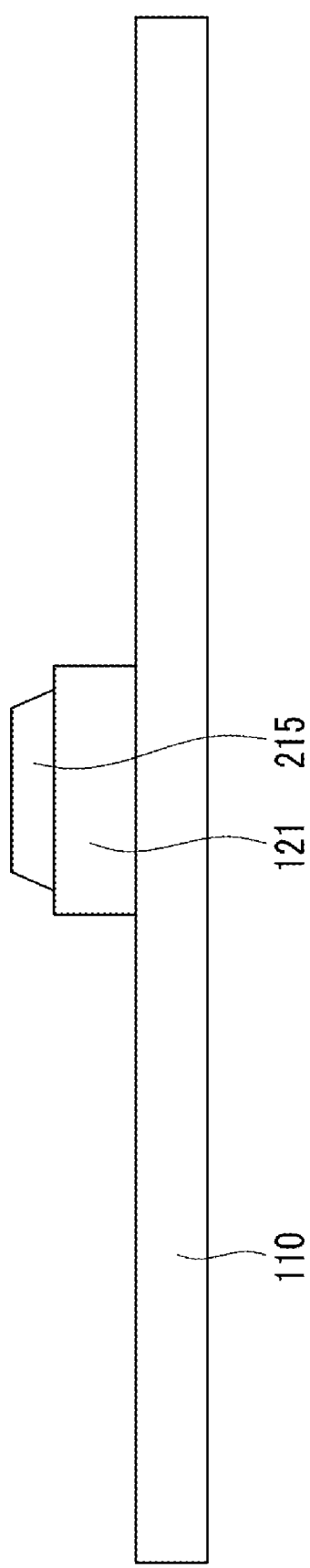
FIGS. 29 to 32 are cross-sectional views in intermediate steps of an exemplary method of manufacturing the exemplary TFT array panel of FIG. 20.

As shown in FIGS. 21, 25, and 29, a gate line 121 and a gate electrode 124 that are made of aluminum (Al), copper (Cu), or alloys thereof and that have a thickness of about 0.5 µm to about 5 µm are formed or otherwise disposed on a substrate 110. Because the gate line 121 is thick, when forming the gate line 121, the insulation substrate 110 may be deformed, and in order to prevent this, a buffer layer (see 115 of FIG. 33) that is made of silicone nitride (SiNx), etc., may be additionally formed and disposed between the insulation substrate 110 and the gate line 121. Thereafter, a barrier rib 215 that divides a horizontal part that is formed along the gate line 121 and adjacent pixels in a horizontal direction and that includes a vertical part that is formed at a position at which a data line is to be formed and a contact part that is formed at a position at which a pixel electrode and a drain electrode are connected is formed or otherwise disposed. The barrier rib 215 has a thickness of about 0.5 µm to about 10 µm and is made of an organic material, and partitions a region where a color filter is to be formed. The barrier rib 215 of the present exemplary embodiment has a narrower width than that of the gate line 121, as shown in FIG. 29. In other words, a footprint or periphery of the barrier rib 215 lies within a footprint or periphery of the gate line 121. The barrier rib 215 has a height of about 1 µm to about 4 µm from the gate line 121, and because the barrier rib 215 is etched on the gate electrode 124, the gate electrode 124 is exposed through an opening in the barrier rib 215, as shown in FIG. 25. However, according to exemplary embodiments, a part of the barrier rib 215 may remain on the gate electrode 124. When forming the barrier rib 215, it is preferable to expose and develop using a mask, and because a transflective region or a slit pattern is formed in a mask portion corresponding to the gate electrode 124, all patterns of the barrier rib 215 can be formed together by exposure and development at one time. The barrier rib 215 that is made of an organic material is inclined to a surface of the substrate 110, and a tilt angle thereof is preferably about 50° to about 120°. Further, as an organic material that forms the barrier rib 215, an organic material having a low dielectric constant of about 3.5 or less, or an organic material to which at least one material of a surfactant, a silicon (Si)-based material, and a fluorine (F)-based material is added may be used. Further, through adjusting an additive (fluorine, etc.) that is added to a material that forms an organic film, or through surface treatment after forming the barrier rib 215 with an organic film, the profile of the barrier rib 215 can be adjusted.

Figure 22:
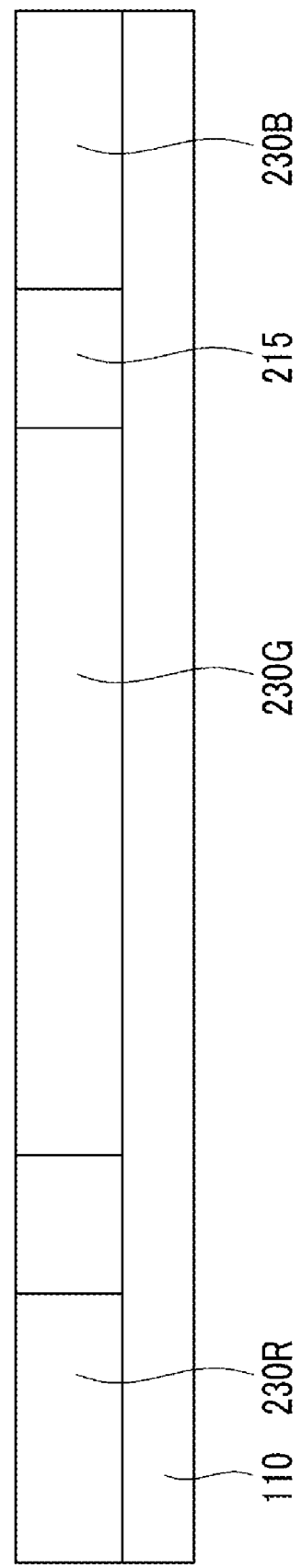

Next, as shown in FIG. 22, a color filter 230 is formed using an Inkjet method within a region enclosed by the barrier rib 215. The color filter 230 of each color is formed in different processes, and because the barrier rib 215 has a high height and a great taper angle, the color filter 230 is uniformly formed. The color filter 230 is formed in a thickness of about 1 µm to about 4 µm. Further, in FIG. 18, the color filter 230 has substantially the same height as that of the barrier rib 215, but heights of the color filter 230 and the barrier rib 215 are not limited thereto, and the color filter 230 may have a height that is lower or higher than that of the barrier rib 215. Further, it is preferable that a thickness difference between the color filter 230 and the barrier rib 215 is about 2 µm or less.

Figure 23:
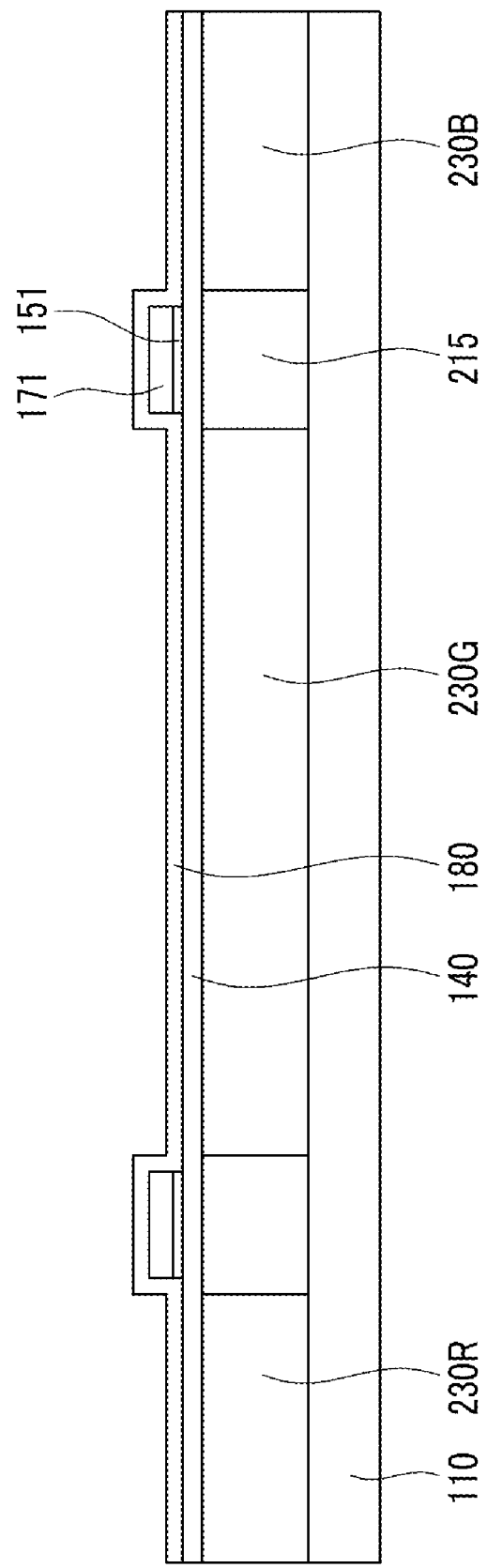
Figure 26:
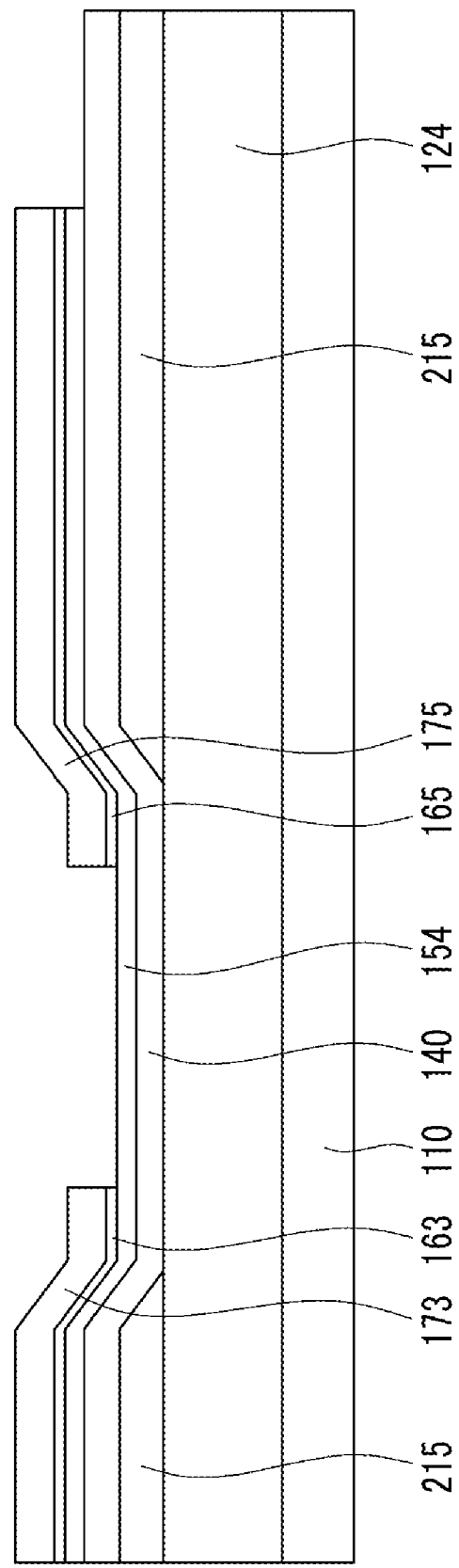
Figure 30:
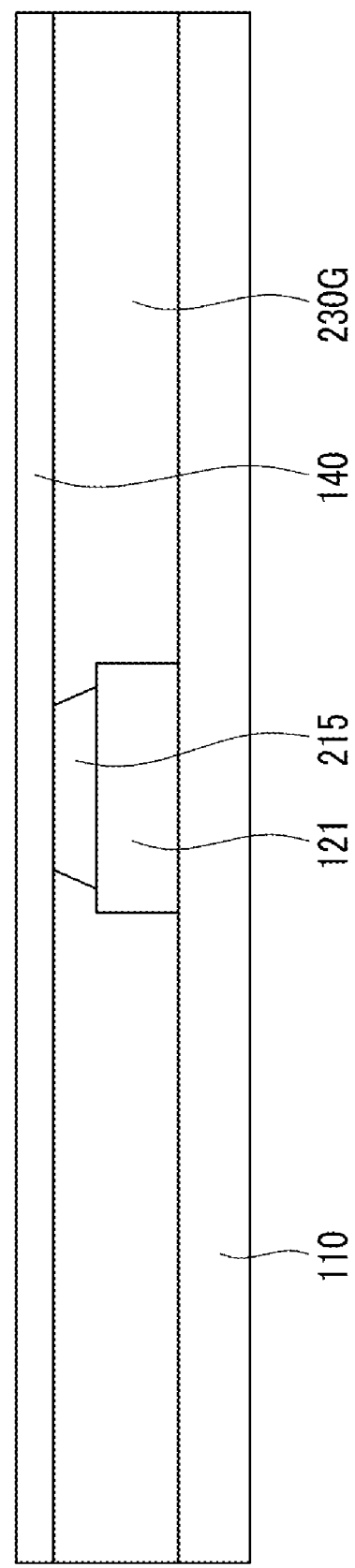

Next, as shown in FIGS. 23, 26, and 30, after forming a gate insulating layer 140 in a thickness of about 0.3 µm to about 3 µm in an entire region of the substrate 110, a semiconductor 151, ohmic contact layers 163 and 165, a data line 171, and a drain electrode 175 are formed or otherwise disposed on the gate insulating layer 140. The semiconductor 151, the ohmic contact layers 163 and 165, the data line 171, and the drain electrode 175 are formed together by etching at one time using one mask including a transflective region or a slit pattern. As a result, outer cross-sections or peripheries of the semiconductor 151, the ohmic contact layers 163 and 165, the data line 171, and the drain electrode 175 coincide with each other. A channel is created by exposing the semiconductor 154 between the drain electrode 175 and source electrode 173 over the gate electrode 124.

Figure 27:
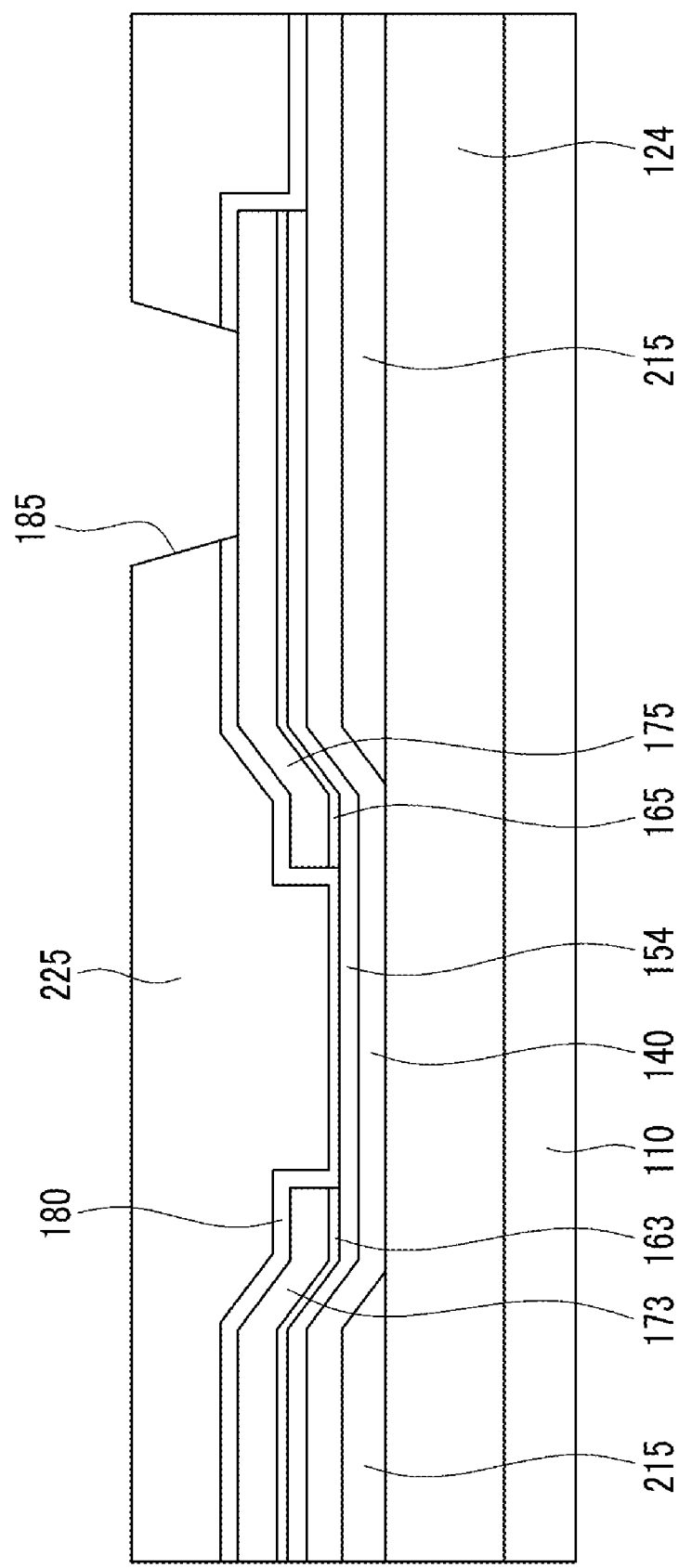
Figure 31:
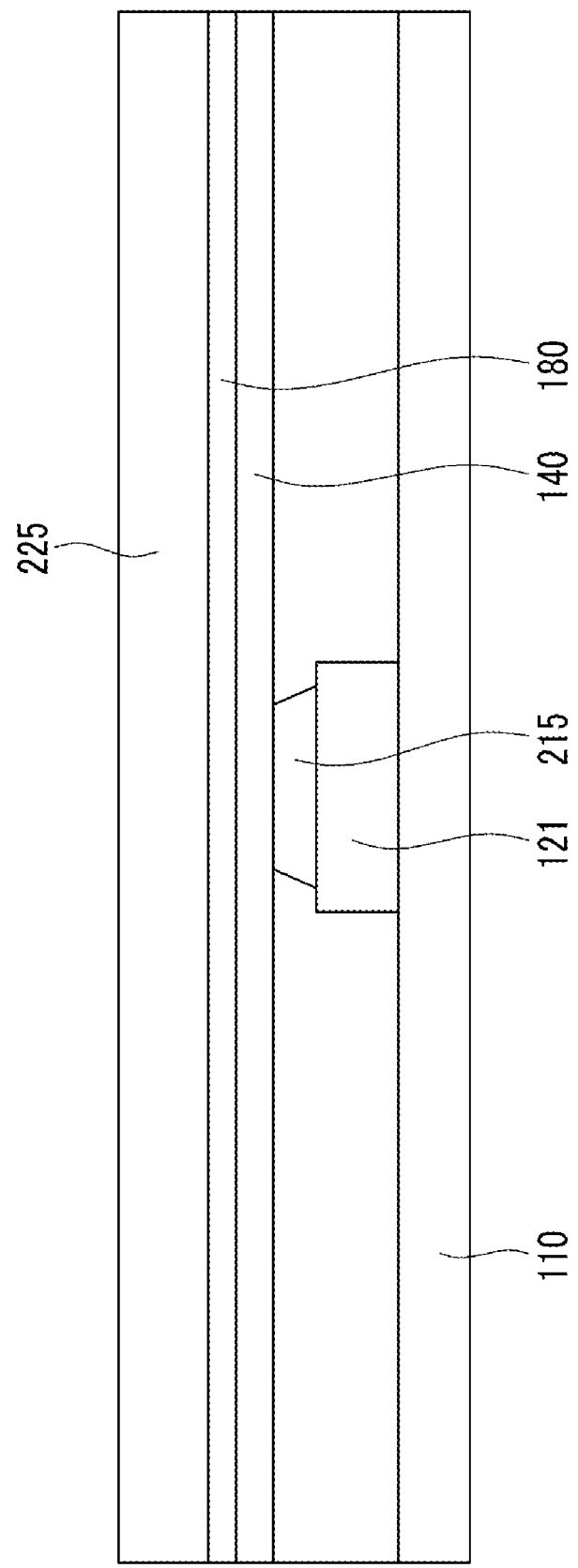

Next, as shown in FIGS. 27 and 31, a passivation layer 180 and an organic capping layer 225 are sequentially stacked in an entire region of the substrate 110. The passivation layer 180 is made of an inorganic insulating material, and the organic capping layer 225 is formed in a thickness of about 1 µm to about 5 µm using an organic material of a low dielectric constant of about 3.5 or less. Thereafter, by removing a portion of the passivation layer 180 and a portion of the organic capping layer 225 that are formed on the drain electrode 175, a contact hole 185 is formed. Here, the contact hole 185 may be formed with the following method. First, after removing by exposing and developing the organic capping layer 225 in an upper part of the drain electrode 175, the passivation layer 180 in an upper part of the drain electrode 175 is dry-etched and removed. As a result, the drain electrode 175 is exposed to the outside.

Figure 24:
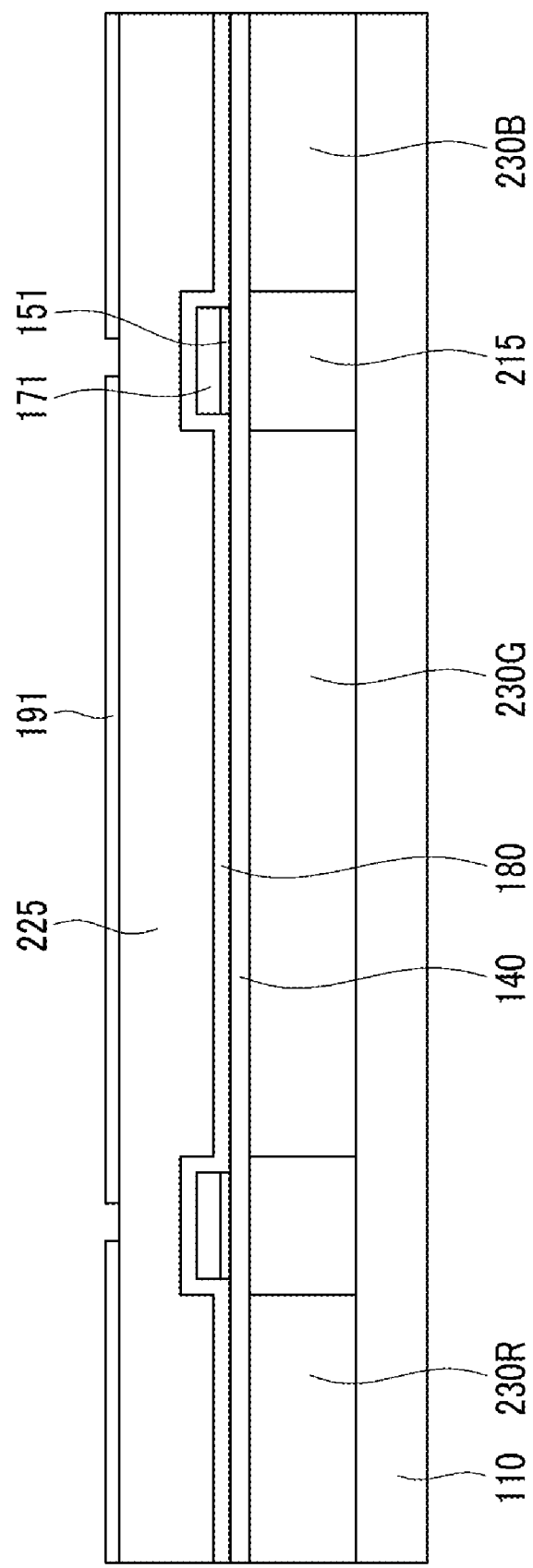
Figure 28:
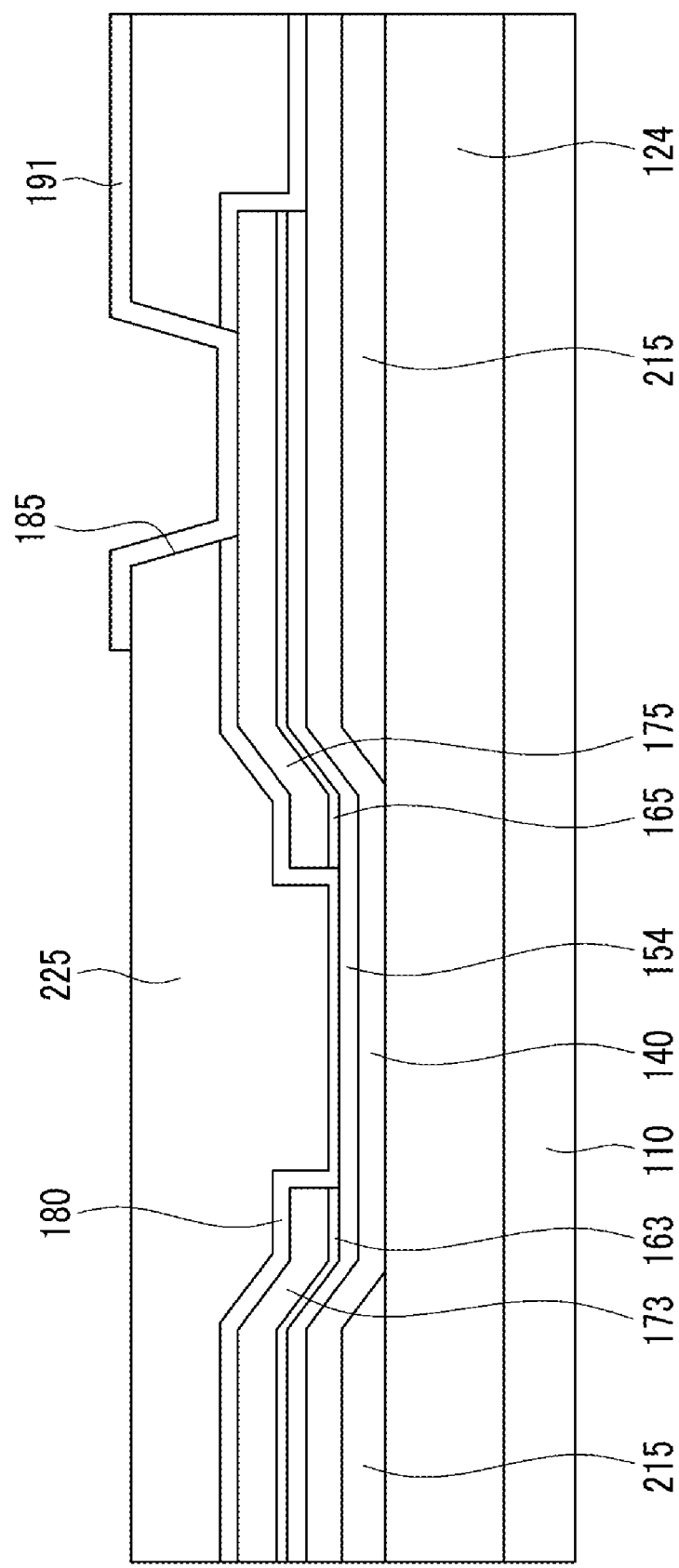
Figure 32:
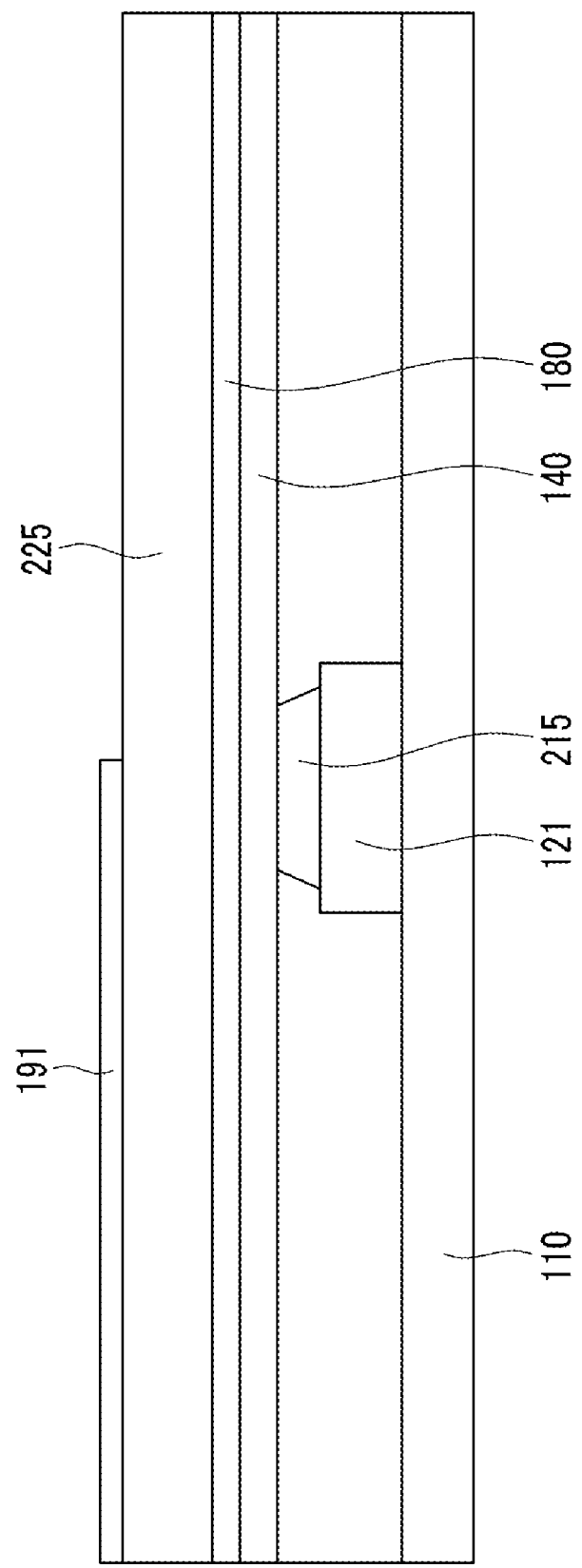

Next, as shown in FIGS. 24, 28, and 32, a pixel electrode 191 is formed on the organic capping layer 225. The pixel electrode 191 is electrically connected to the drain electrode 175 through the contact hole 185, and although not shown, the pixel electrode 191 may include a slit pattern. Further, a light blocking member (not shown) may further be formed on the organic capping layer 225. The light blocking member is formed in an upper part of a position at which the barrier rib 215 is formed and in a wider width than that of the barrier rib 215. In other words, a footprint or periphery of the barrier rib 215 lies within a footprint or periphery of the light blocking member. Further, the light blocking member may be formed to have different heights, and a light blocking member having a higher height may perform a function of a spacer for uniformly sustaining a gap between upper and lower substrates.

Figure 33:
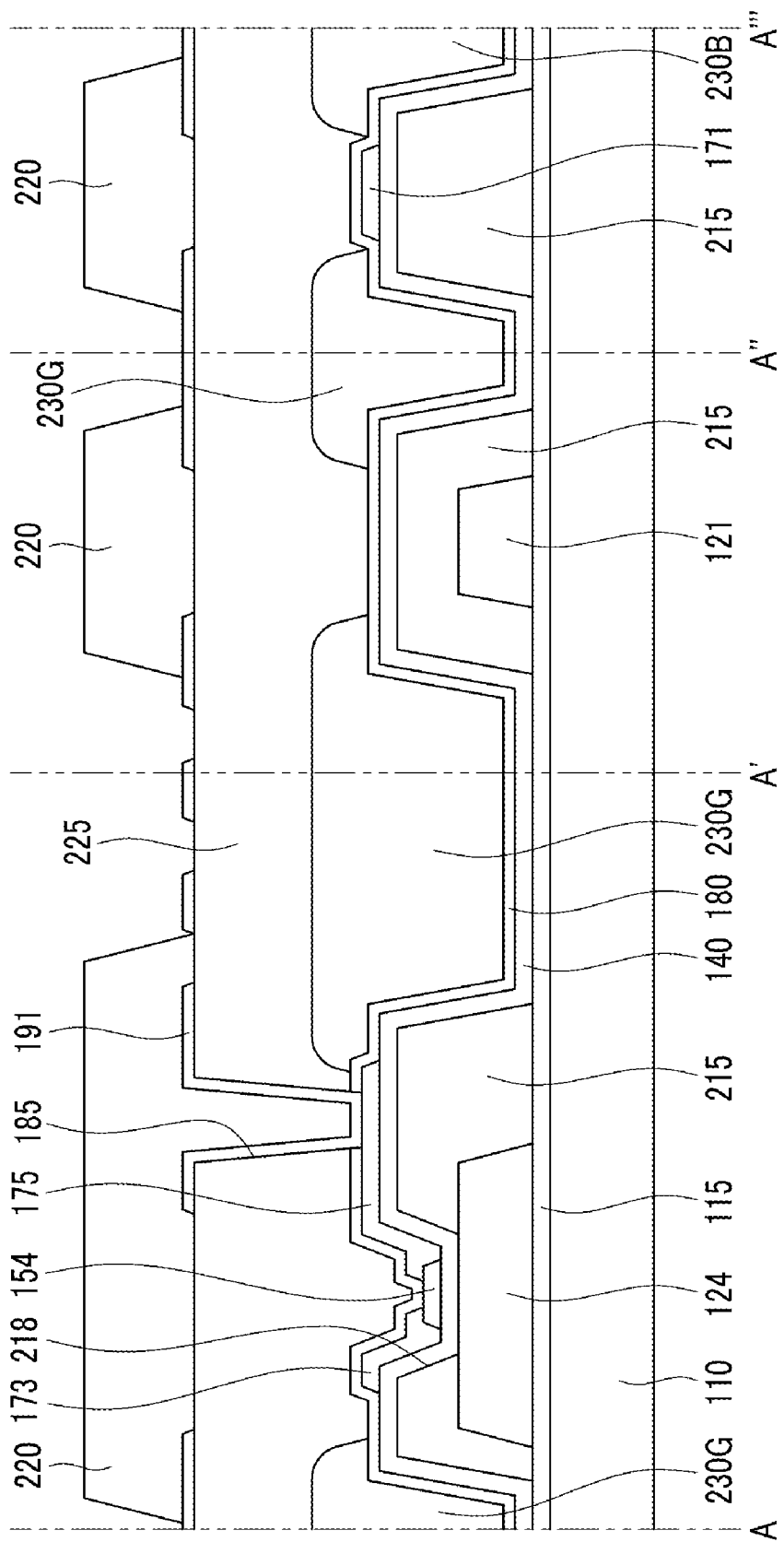
FIG. 33 is a cross-sectional view of an exemplary TFT array panel according to another exemplary embodiment of the present invention; and, FIG. 34 is a layout view of an exemplary TFT array panel according to another exemplary embodiment of the present invention.

FIG. 33 corresponds to FIG. 2, and illustrates an exemplary embodiment having a buffer layer 115 between the insulation substrate 110 and the gate line 121 and gate electrode 124. As described above, because the gate line 121 is formed in a thick thickness, the substrate 110 may be deformed, and in order to prevent this, the buffer layer 115 is formed. Other structures may otherwise be the same as those of FIG. 2.

A structure of a pixel electrode having a micro-slit pattern is described hereinafter in detail with reference to FIG. 34.

Figure 34:
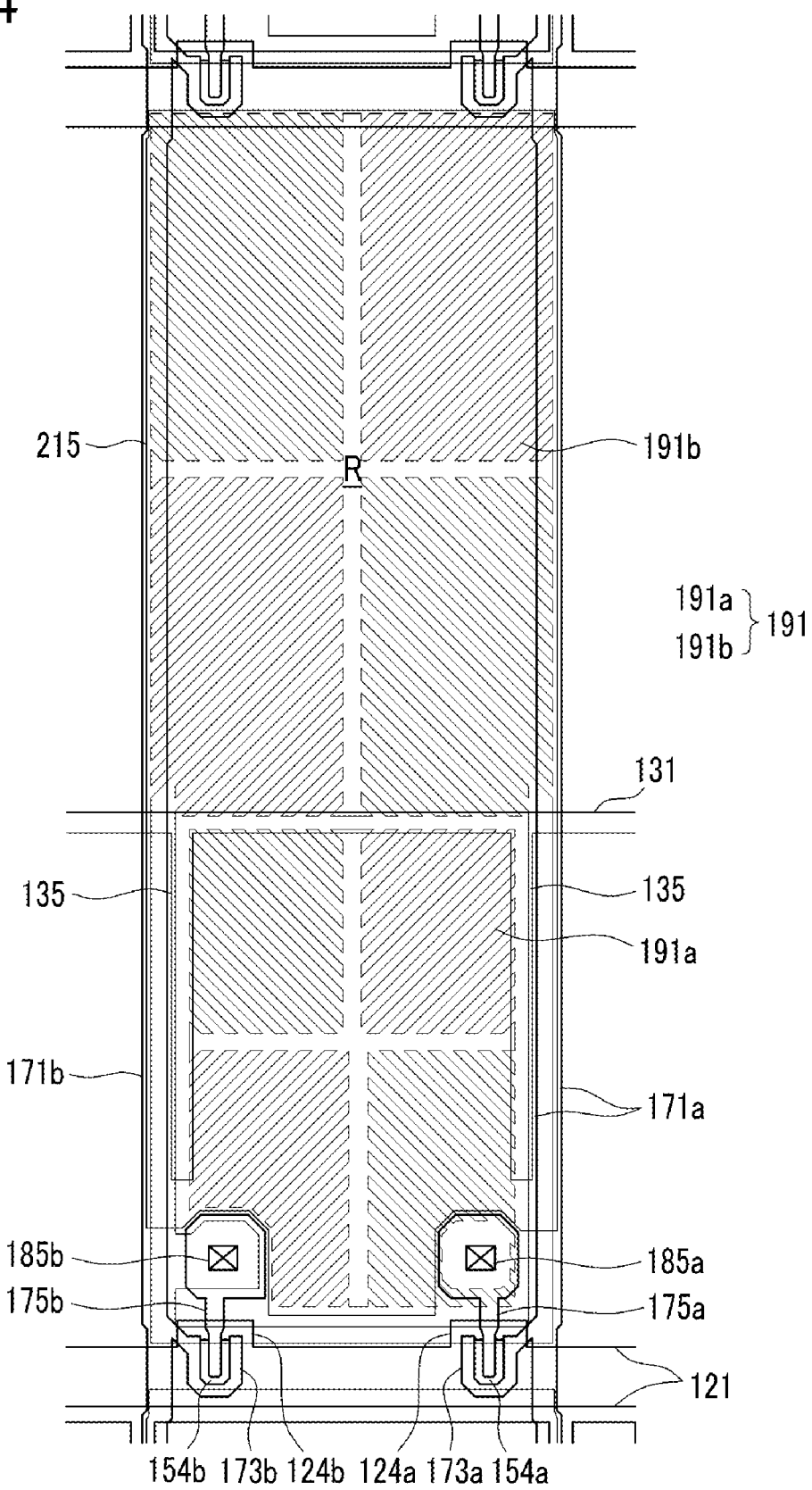

FIG. 34 is a layout view of an exemplary TFT array panel according to another exemplary embodiment of the present invention.

An exemplary embodiment of FIG. 34 includes storage electrode lines 131 and 135 and clearly illustrates a slit pattern of the pixel electrode. A cross-sectional structure thereof may be the same or substantially the same as that of any one of the exemplary embodiment of FIGS. 1 to 16 and the exemplary embodiment of FIGS. 17 to 32, and thus a color filter 230 may be formed on a substrate 110 or on a passivation layer 180.

FIG. 34 shows only characteristic portions.

In addition to a gate line 121, storage electrode lines 131 and 135 are formed on the insulation substrate 110. The storage electrode lines 131 and 135 include a branch line 131 that is extended substantially parallel to the gate line 121 and a plurality of storage electrodes 135 that are extended therefrom. The storage electrode 135 is formed in a linear line shape toward the TFTs along the data lines 171a and 171b.

A pixel electrode 191 includes two subpixel electrodes 191a and 191b.

The entire shape of the first and second subpixel electrodes 191a and 191b is a quadrangular shape, and includes a cross-shaped branch part including a horizontal branch part and a vertical branch part that is orthogonal thereto. Further, the first and second subpixel electrodes 191a and 191b are divided into four sub-regions by the horizontal branch part and the vertical branch part, and each sub-region includes a plurality of micro-branch parts.

One of the micro-branch parts obliquely extends in a left upper direction from the horizontal branch part or the vertical branch part, and another micro-branch part obliquely extends in a right upper direction from the horizontal branch part or the vertical branch part. Further, another micro-branch part obliquely extends in a left lower direction from the horizontal branch part or the vertical branch part, and the remaining micro-branch part obliquely extends in a right lower direction from the horizontal branch part or the vertical branch part.

Each micro-branch part forms an angle of about 45° or about 135° relative to the gate line 121 or the horizontal branch part. Further, micro-branch parts of two neighboring sub-regions may be orthogonal to each other.

Although not shown, when approaching the horizontal branch part or the vertical branch part, the micro-branch part may have an increased width.

Further, in the entire pixel electrode 191, an occupying area of the second subpixel electrode 191b may be larger than that of the first subpixel electrode 191a, and the second subpixel electrode 191b may have an area of about 1.0 to about 2.2 times that of the first subpixel electrode 191a. However, a form or an area ratio of the first and second subpixel electrodes 191a and 191b may be variously changed.

The first and second subpixel electrodes 191a and 191b of the above-described structure may receive different voltages through different TFTs, and thus visibility is improved and the viewing angle increases. A first TFT may include a first gate electrode 124a protruding from the gate line 121, a first semiconductor 154a, a first source electrode 173a protruding from the first data line 171a, and a first drain electrode 175a. The first subpixel electrode 191a may contact the first drain electrode 175a through the contact hole 185a to receive a first voltage. A second TFT may include a second gate electrode 124b protruding from the gate line 121, a second semiconductor 154b, a second source electrode 173b protruding from the second data line 171b, and a second drain electrode 175b. The second subpixel electrode 191b may contact the second drain electrode 175b through the contact hole 185b to receive a second voltage that may be different from the first voltage.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
an insulation substrate;
a gate line disposed on the insulation substrate and including a gate electrode;
a barrier rib that is made of an organic material and that includes a vertical part;
a color filter that is formed in a region that is defined by the barrier rib;
a thin film transistor that includes the gate electrode, portions of the thin film transistor disposed on the barrier rib; and
a data line that intersects the gate line and that is disposed along the vertical part of the barrier rib on the barrier rib, wherein the barrier rib is disposed between the data line and the insulation substrate.

2. The thin film transistor array panel of claim 1, wherein the portions of the thin film transistor is a part of a source electrode or a drain electrode of the thin film transistor.

3. The thin film transistor array panel of claim 1, wherein a portion of the barrier rib that is on an upper part of the gate electrode has a smaller thickness than other parts of the barrier rib, or is removed to expose the gate electrode.

4. The thin film transistor array panel of claim 1, wherein the organic material that forms the barrier rib has a dielectric constant of about 3.5 or less.

5. The thin film transistor array panel of claim 1, further comprising a gate insulating layer disposed on the barrier rib and a passivation layer disposed on the thin film transistor and the gate insulating layer, wherein the color filter is disposed on the passivation layer.

6. The thin film transistor array panel of claim 5, further comprising an organic capping layer disposed on the color filter and passivation layer, a pixel electrode disposed on the organic capping layer.

7. The thin film transistor array panel of claim 1, further comprising a gate insulating layer disposed on the barrier rib, wherein the color filter is disposed between the gate insulating layer and the insulation substrate.

8. The thin film transistor array panel of claim 7, further comprising a passivation layer disposed on the thin film transistor and the gate insulating layer, an organic capping layer disposed on the passivation layer, a pixel electrode disposed on the organic capping layer.

9. The thin film transistor array panel of claim 1, wherein the barrier rib does not include a light blocking member.

10. The thin film transistor array panel of claim 1, further comprising a pixel electrode in contact with the thin film transistor through a contact hole and a light blocking member disposed on portions of the pixel electrode, wherein the contact hole does not pass through the color filter or through the light blocking member.

11. The thin film transistor array panel of claim 1, wherein the organic material for the barrier rib is a transparent organic material.

12. A method of manufacturing a thin film transistor array panel, the method comprising:
    forming gate lines and gate electrodes on an insulation substrate;
    forming a barrier rib, including a horizontal part that contacts and overlaps the gate lines and a vertical part, with an organic material;
    forming a gate insulating layer and a semiconductor;
    forming data lines and a drain electrode on the gate insulating layer and the semiconductor;
    forming a passivation layer that covers the semiconductor, the data lines, and the drain electrode; and
    forming a color filter with an Inkjet method in a region that is partitioned by the barrier rib on the passivation layer,
    wherein the barrier rib is disposed between the data line and the insulation substrate.

13. The method of claim 12, further comprising forming a part of the barrier rib on an upper part of the gate electrodes to have a smaller thickness than other parts of the barrier rib, or removing the part of the barrier rib on the gate electrodes in order to expose the gate electrodes.

14. The method of claim 13, further comprising forming the barrier rib with exposure and development of one time using a mask including a transflective region or a slit pattern.

15. The method of claim 12, wherein the organic material that forms the barrier rib has a dielectric constant of about 3.5 or less.

16. A method of manufacturing a thin film transistor array panel, the method comprising:
    forming a gate line and a gate electrode on an insulation substrate;
    forming a barrier rib, including a horizontal part that contacts and overlaps the gate line and a vertical part, with an organic material;
    forming a color filter with an Inkjet method in a region that is partitioned by the barrier rib on the insulation substrate;
    forming a gate insulating layer and a semiconductor on the color filter;
    forming a data line and a drain electrode on the gate insulating layer and the semiconductor; and
    forming a passivation layer that covers the semiconductor, the data line, and the drain electrode,
    wherein the barrier rib is disposed between the data line and the insulation substrate.

17. The method of claim 16, further comprising forming a part of the barrier rib that is formed on an upper part of the gate electrode to have a smaller thickness than other parts of the barrier rib, or removing a part of the barrier rib in order to expose the gate electrode.

18. The method of claim 17, wherein forming a barrier rib comprises:
    removing a part of the barrier rib or completely removing a part of the barrier rib in a region where the gate electrode and the horizontal part overlap; and
    forming the barrier rib with exposure and development of one time using a mask including a transflective region or a slit pattern.

19. The method of claim 16, wherein the organic material that forms the barrier rib has a dielectric constant of about 3.5 or less.

* * * * *